US010803970B2

(12) United States Patent
Schuh et al.

(10) Patent No.: US 10,803,970 B2
(45) Date of Patent: Oct. 13, 2020

(54) SOLID-STATE DISK MANUFACTURING SELF TEST

(75) Inventors: Karl David Schuh, Santa Cruz, CA (US); Karl Huan-Yao Ko, Sunnyvale, CA (US); Aloysius C. Ashley Wijeyeratnam, Newark, CA (US); Steven Gaskill, Campbell, CA (US); Thad Omura, Los Altos, CA (US); Sumit Puri, Fremont, CA (US); Jeremy Isaac Nathaniel Werner, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 32 days.

(21) Appl. No.: 13/436,639

(22) Filed: Mar. 30, 2012

(65) Prior Publication Data
US 2013/0124932 A1 May 16, 2013

Related U.S. Application Data

(60) Provisional application No. 61/559,201, filed on Nov. 14, 2011.

(51) Int. Cl.
*G11C 29/08* (2006.01)
*G11C 29/16* (2006.01)
(Continued)

(52) U.S. Cl.
CPC ............... *G11C 29/08* (2013.01); *G06F 9/44* (2013.01); *G11C 29/16* (2013.01); *G11C 29/26* (2013.01);
(Continued)

(58) Field of Classification Search
CPC ................................................... G11C 29/08
See application file for complete search history.

(56) References Cited

U.S. PATENT DOCUMENTS 4,319,323 A * 3/1982 Ermolovich .......... G06F 13/122
711/100
5,150,465 A * 9/1992 Bush ..................... G06F 3/0601
710/11
(Continued)

FOREIGN PATENT DOCUMENTS

JP 2000090014 A 3/2000
JP 2001-236797 A 8/2001
(Continued)

OTHER PUBLICATIONS

International Search Report and the Written Opinion in the related PCT/US12/64682, 9 pages.

*Primary Examiner* — Jacob C. Coppola
(74) *Attorney, Agent, or Firm* — Hall Estill Attorneys at Law

(57) ABSTRACT

A Solid-State Disk (SSD) Manufacturing Self Test (MST) capability enables an SSD manufacturer to generate and load tests onto SSDs, run the tests, and gather results. The SSDs self execute the loaded tests when powered up. The self executing is while coupled to a host that loaded the tests or while coupled to a rack unable to load the tests but enabled to provide power to the SSDs. The rack is optionally cost-reduced to enable cost-efficient parallel testing of relatively larger numbers of SSDs for production. The host writes the tests to an 'input' SMART log of each SSD, and each SSD writes results to a respective included 'output' SMART log. The commands include write drive, erase drive, SATA PHY burn-in, delay, and stress mode. The SSD MST capability is optionally used in conjunction with an SSD virtual manufacturing model.

17 Claims, 18 Drawing Sheets

(51) Int. Cl.
*G11C 29/26* (2006.01)
*G06F 9/44* (2018.01)
*G11C 29/44* (2006.01)
*G11C 29/06* (2006.01)
*G11C 29/04* (2006.01)
*G11C 16/00* (2006.01)

(52) U.S. Cl.
CPC .............. *G11C 16/00* (2013.01); *G11C 29/06* (2013.01); *G11C 29/44* (2013.01); *G11C 2029/0407* (2013.01)

(56) References Cited

U.S. PATENT DOCUMENTS

| | | | | |
|---|---|---|---|---|
| 5,615,335 | A * | 3/1997 | Onffroy | G11C 29/12 714/25 |
| 5,675,800 | A * | 10/1997 | Fisher, Jr. | G06F 9/4416 709/208 |
| 5,712,978 | A * | 1/1998 | Lerner et al. | 709/224 |
| 6,467,054 | B1 * | 10/2002 | Lenny | G06F 11/004 369/53.17 |
| 6,591,389 | B1 * | 7/2003 | Daudelin | G06F 11/2268 714/733 |
| 6,907,555 | B1 | 6/2005 | Nomura et al. | |
| 6,950,967 | B1 * | 9/2005 | Brunnett | G06F 11/2221 360/53 |
| 7,243,043 | B2 * | 7/2007 | Shin | G06F 11/2221 702/182 |
| 7,330,967 | B1 * | 2/2008 | Pujare et al. | 713/2 |
| 7,730,293 | B2 * | 6/2010 | Owhadi | G11B 5/455 713/1 |
| 2003/0156473 | A1 * | 8/2003 | Sinclair | G06F 9/4403 365/200 |
| 2003/0212735 | A1 * | 11/2003 | Hicok et al. | 709/201 |
| 2004/0133790 | A1 * | 7/2004 | Hensley | 713/191 |
| 2005/0050410 | A1 * | 3/2005 | Pomaranski | G11C 29/56 714/723 |
| 2005/0081112 | A1 * | 4/2005 | Aguilar et al. | 714/39 |
| 2005/0097236 | A1 * | 5/2005 | Delaney | G06F 8/65 710/15 |
| 2005/0149713 | A1 * | 7/2005 | Rothman et al. | 713/1 |
| 2006/0143600 | A1 | 6/2006 | Cottrell et al. | |
| 2006/0182282 | A1 * | 8/2006 | Negahdar | 380/277 |
| 2006/0216841 | A1 | 9/2006 | Murin et al. | |
| 2008/0072068 | A1 * | 3/2008 | Wang | G06F 21/572 713/191 |
| 2008/0155332 | A1 * | 6/2008 | Landers | G06F 11/1417 714/36 |
| 2010/0058141 | A1 * | 3/2010 | Fukase | 714/752 |
| 2011/0145598 | A1 | 6/2011 | Smith | |
| 2011/0197185 | A1 | 8/2011 | Hobbet | |
| 2011/0225412 | A1 | 9/2011 | Van De Ven | |
| 2011/0238967 | A1 | 9/2011 | Challener | |
| 2012/0023303 | A1 * | 1/2012 | Russo | G06F 21/79 711/166 |
| 2012/0036373 | A1 * | 2/2012 | Kofman | G06F 21/572 713/193 |
| 2013/0036258 | A1 * | 2/2013 | Teo | G06F 12/0246 711/103 |

FOREIGN PATENT DOCUMENTS

| | | |
|---|---|---|
| JP | 2002-109899 A | 4/2002 |
| JP | 2004102981 A | 4/2004 |
| JP | 2008108326 A | 5/2008 |
| JP | 2011505046 A | 2/2011 |
| JP | 2014519112 A | 8/2014 |
| WO | 2010/095703 A | 8/2010 |
| WO | WO 2013/074455 A1 | 5/2013 |

\* cited by examiner

Example MST Input, 1200

| Command | Description |
|---|---|
| 0x00001001 | WRITE DRIVE |
| 0x00000002 | Two parameter pairs |
| 0x00000001 | Number of cycles indicator |
| 0x00000001 | One cycle |
| 0x0000000C | Do not erase indicator |
| 0x00000001 | Do not erase drive when command completes |
| 0x00001001 | WRITE DRIVE |
| 0x00000003 | Three parameter pairs |
| 0x00000001 | Number of cycles indicator |
| 0x00000001 | One cycle |
| 0x0000000B | Pick random blocks indicator |
| 0x00000001 | Pick random blocks |
| 0x0000000C | Do not erase indicator |
| 0x00000001 | Do not erase drive when command completes |
| 0x8888CAFE | Sentinel marking end of input |

Fig. 12

MST Results Log, 1400

| Log Field | Log Field Elements |
|---|---|
| Log Header 1401 | Length, Result Type, Version |
| Test State 1402 | Not Activated, Activated, Running, End of Input, Aborted, Error |
| Progress Indicators 1403 | Input Offset, Current Cmd, Remaining Blocks, Elapsed Time |
| Statistics 1404 | Temperature, Grown Defects, Remapped Blocks, Error Free Reads |
| Errors 1405 | Correctable ECC Errors, Uncorrectable ECC Errors, Program Errors, Erase Errors, Bit Error Counts, Error Events |

Fig. 14

SOLID-STATE DISK MANUFACTURING SELF TEST

CROSS REFERENCE TO RELATED APPLICATIONS

Priority benefit claims for this application are made in the accompanying Application Data Sheet, Request, or Transmittal (as appropriate, if any). To the extent permitted by the type of the instant application, this application incorporates by reference for all purposes the following applications, all commonly owned with the instant application at the time the invention was made:

U.S. Provisional Application Ser. No. 61/559,201, filed Nov. 14, 2011, first named inventor Thad OMURA, and entitled Virtual Drive Manufacturing Model.

BACKGROUND

Field

Advancements in flash memory storage technology are needed to provide improvements in performance, efficiency, and utility of use.

Related Art

Unless expressly identified as being publicly or well known, mention herein of techniques and concepts, including for context, definitions, or comparison purposes, should not be construed as an admission that such techniques and concepts are previously publicly known or otherwise part of the prior art. All references cited herein (if any), including patents, patent applications, and publications, are hereby incorporated by reference in their entireties, whether specifically incorporated or not, for all purposes.

SYNOPSIS

The invention may be implemented in numerous ways, e.g. as a process, an article of manufacture, an apparatus, a system, a composition of matter, and a computer readable medium such as a computer readable storage medium (e.g., media in an optical and/or magnetic mass storage device such as a disk, an integrated circuit having non-volatile storage such as flash storage), or a computer network wherein program instructions are sent over optical or electronic communication links. The Detailed Description provides an exposition of one or more embodiments of the invention that enable improvements in cost, profitability, performance, efficiency, and utility of use in the field identified above. The Detailed Description includes an Introduction to facilitate understanding of the remainder of the Detailed Description. The Introduction includes Example Embodiments of one or more of systems, methods, articles of manufacture, and computer readable media in accordance with concepts described herein. As is discussed in more detail in the Conclusions, the invention encompasses all possible modifications and variations within the scope of the issued claims.

BRIEF DESCRIPTION OF DRAWINGS

FIG. 12 illustrates selected details of an example of an MST.

FIG. 14 illustrates selected details of an embodiment of an MST results log.

LIST OF REFERENCE SYMBOLS IN DRAWINGS

Figure 1A:
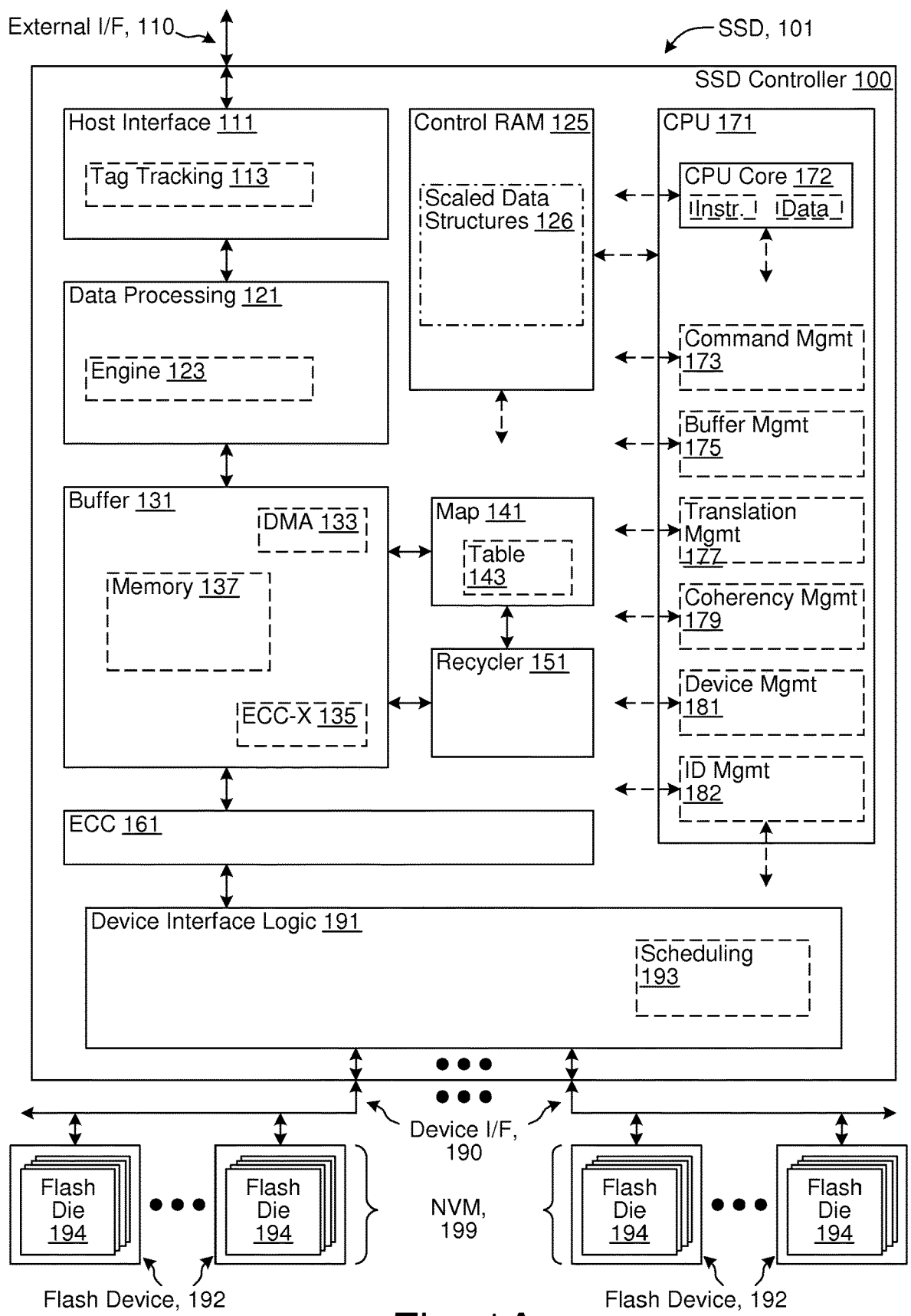
FIG. 1A illustrates selected details of an embodiment of a Solid-State Disk (SSD) including an SSD controller compatible for use with an SSD Manufacturing Self Test (MST).

| Ref. Symbol | Element Name |
| --- | --- |
| 100 | SSD Controller |
| 101 | SSD |
| 102 | Host |
| 103 | (optional) Switch/Fabric/Intermediate Controller |
| 104 | Intermediate Interfaces |
| 105 | OS |
| 106 | FirmWare (FW) |
| 107 | Driver |

-continued

| Ref. Symbol | Element Name |
|---|---|
| 107D | dotted-arrow (Host Software ←→ I/O Device Communication) |
| 109 | Application |
| 109D | dotted-arrow (Application ←→ I/O Device Communication via driver) |
| 109V | dotted-arrow (Application ←→ I/O Device Communication via VF) |
| 110 | External Interfaces |
| 111 | Host Interfaces |
| 112C | (optional) Card Memory |
| 113 | Tag Tracking |
| 114 | Multi-Device Management Software |
| 115 | Host Software |
| 116 | I/O Card |
| 117 | I/O & Storage Devices/Resources |
| 118 | Servers |
| 119 | LAN/WAN |
| 121 | Data Processing |
| 123 | Engines |
| 125 | Control RAM |
| 126 | Scaled Data Structures |
| 131 | Buffer |
| 133 | DMA |
| 135 | ECC-X |
| 137 | Memory |
| 141 | Map |
| 143 | Table |
| 151 | Recycler |
| 161 | ECC |
| 171 | CPU |
| 172 | CPU Core |
| 173 | Command Management |
| 175 | Buffer Management |
| 177 | Translation Management |
| 179 | Coherency Management |
| 180 | Memory Interface |
| 181 | Device Management |
| 182 | Identity Management |
| 190 | Device Interfaces |
| 191 | Device Interface Logic |
| 192 | Flash Device |
| 193 | Scheduling |
| 194 | Flash Die |
| 199 | NVM |
| 211 | LBA |
| 213 | LPN |
| 215 | Logical Offset |
| 221 | Map Info for LPN |
| 223 | Read Unit Address |
| 225 | Length in Read Units |
| 311 | Read Data |
| 313 | First Read Unit |
| 315 | Last Read Unit |
| 401A | Read Unit |
| 401B | Read Unit |
| 410B | Header Marker (HM) |
| 411A | Header 1 |
| 411B | Header 1 |
| 412B | Header 2 |
| 419A | Header N |
| 419B | Header N |
| 421A | Data Bytes |
| 421B | Data Bytes |
| 422B | Data Bytes |
| 429B | Data Bytes |
| 431A | Optional Padding Bytes |
| 431B | Optional Padding Bytes |
| 501 | Header |
| 511 | Type |
| 513 | Last Indicator |
| 515 | Flags |
| 517 | LPN |
| 519 | Length |
| 521 | Offset |
| 610 | Design Vendor |
| 611 | Controller & FirmWare |
| 612 | Reference Design & Flash Recommendation |

-continued

| Ref. Symbol | Element Name |
|---|---|
| 614 | HardWare Verification/Characterization |
| 615 | RDT, EVT, & DVT |
| 616 | Manufacturing SoftWare Tool |
| 617 | Failure Analysis |
| 618 | Selected Design Vendor Operations (dashed-line box) |
| 620 | Manufacturer |
| 623 | Prototype Manufacturing |
| 625 | Volume Manufacturing |
| 627 | Rework |
| 630 | System Vendor |
| 632 | BOM Selection, BOM Procurement, and Design Approval |
| 634 | System Quality Assurance |
| 635 | Volume Manufacturing |
| 636 | RMA/Servicing |
| 637 | Failure Analysis |
| 655 | Volume Manufacturing |
| 701 | License File |
| 702 | Encryption Key(s) |
| 703 | Distribution Firmware Package |
| 704 | System Vendor Desired Drive Settings |
| 711 | Package Manager |
| 712 | Configuration Manager |
| 721 | Manufacturing Firmware Package |
| 722 | Drive Configuration and Settings File |
| 723 | Field Update Firmware Package |
| 730A | Engineering |
| 730C | Engineering |
| 740E | End User |
| 740F | Factory |
| 750F | Fresh SSD |
| 750L | Firmware Loaded SSD |
| 750X | (Old) Firmware Loaded SSD |
| 750Y | (New) Firmware Loaded SSD |
| 751 | Manufacturing SoftWare Tool (MT) |
| 753 | SSD Update SoftWare Tool (UT) |
| 754 | Update Key(s) |
| 760 | Serial Number, World Wide Name (WWN) |
| 780E | Host |
| 780P | Host |
| 790E.1 | SSD.1 |
| 790E.N | SSD.N |
| 790P.1 | SSD.1 |
| 790P.N | SSD.N |
| 800 | LBA to NVM Location Mapping |
| 810 | FLM |
| 810.1 | SLM Page/Length |
| 810.2 | SLM Page/Length |
| 810.M | SLM Page/Length |
| 810S | SLM Pointer |
| 820 | SLM Page |
| 820.1 | LB Page/Length |
| 820.2 | LB Page/Length |
| 820.N | LB Page/Length |
| 820L | LB Pointer |
| 821 | LBA |
| 822 | Integer Divider |
| 822Q | FLM Index |
| 822R | SLM Page Index |
| 823 | SLM Entries/SLM Page (CSR) |
| 910 | Prepare MST |
| 911 | Start |
| 912 | Generate MST Commands |
| 913 | Ready SSD for MST Operation |
| 914 | Write MST Commands to SMART Log 0xF8 |
| 915 | Activate MST |
| 916 | Move SSD |
| 920 | Run MST |
| 921 | Power On SSD |
| 922 | Start MST |
| 923 | Execute SMART Log 0xF8 MST Commands |
| 924 | Indicate Progress (LED, Event Log, SMART Log 0xF9) |
| 925 | Complete? |
| 926 | Standby SSD |
| 927 | Move SSD |
| 930 | End MST |

-continued

| Ref. Symbol | Element Name |
|---|---|
| 931 | Power On SSD |
| 932 | Read Results (Event Log, Defects, SMART Log 0xF9) |
| 933 | Send MST_COMPLETE Command |
| 934 | Secure Erase, Clear SMART |
| 935 | Ready SSD for SATA Operation |
| 936 | Disconnect SSD |
| 980 | Host/Rack |
| 981 | MST Commands |
| 982 | Results |
| 984 | LAN/WAN |
| 985 | Storage |
| 990.1 | SSD.1 |
| 990.N | SSD.N |
| 991 | SMART Log 0xF8 (MST Commands) |
| 992 | LED (Progress Indicator) |
| 993 | Event Log (Progress, Results) |
| 994 | SMART Log 0xF9 (Progress, Results) |
| 995 | Defects List |
| 996 | Flash |
| 999 | End |
| 1000 | MST Input |
| 1010 | Command 1 & Parameters 1 |
| 1011 | Command 1 |
| 1012 | Number of Parameter Pairs |
| 1013 | Parameter ID & Value Pair 1 |
| 1014 | Parameter ID & Value Pair N |
| 1020 | Command 2 & Parameters 2 |
| 1080 | Command N & Parameters N |
| 1090 | Sentinel |
| 1100 | MST Commands |
| 1101 | Write Drive |
| 1102 | Erase Drive |
| 1103 | SATA PHY Burn-In |
| 1104 | Delay |
| 1105 | Stress Mode |
| 1200 | Example MST Input |
| 1301-1310 | R-Blocks |
| 1400 | MST Results Log |
| 1401 | Log Header |
| 1402 | Test State |
| 1403 | Progress Indicators |
| 1404 | Statistics |
| 1405 | Errors |

DETAILED DESCRIPTION

A detailed description of one or more embodiments of the invention is provided below along with accompanying figures illustrating selected details of the invention. The invention is described in connection with the embodiments. The embodiments herein are understood to be merely exemplary, the invention is expressly not limited to or by any or all of the embodiments herein, and the invention encompasses numerous alternatives, modifications, and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that in accordance with a predetermined or a dynamically determined criterion perform static and/or dynamic selection of one of a plurality of modes of operation corresponding respectively to a plurality of the multiple embodiments. Numerous specific details are set forth in the following description to provide a thorough understanding of the invention. The details are provided for the purpose of example and the invention may be practiced according to the claims without some or all of the details. For the purpose of clarity, technical material that is known in the technical fields related to the invention has not been described in detail so that the invention is not unnecessarily obscured.

INTRODUCTION

This introduction is included only to facilitate the more rapid understanding of the Detailed Description; the invention is not limited to the concepts presented in the introduction (including explicit examples, if any), as the paragraphs of any introduction are necessarily an abridged view of the entire subject and are not meant to be an exhaustive or restrictive description. For example, the introduction that follows provides overview information limited by space and organization to only certain embodiments. There are many other embodiments, including those to which claims will ultimately be drawn, discussed throughout the balance of the specification.

Acronyms

At least some of the various shorthand abbreviations (e.g. acronyms) defined here refer to certain elements used herein.

| Acronym | Description |
|---|---|
| AES | Advanced Encryption Standard |
| API | Application Program Interface |
| AHCI | Advanced Host Controller Interface |
| ASCII | American Standard Code for Information Interchange |
| ATA | Advanced Technology Attachment (AT Attachment) |
| BCH | Bose Chaudhuri Hocquenghem |
| BOM | Bill Of Materials |
| BIOS | Basic Input/Output System |
| BIST | Built-In Self Test |
| CD | Compact Disk |
| CF | Compact Flash |
| CMOS | Complementary Metal Oxide Semiconductor |
| CPU | Central Processing Unit |
| CRC | Cyclic Redundancy Check |
| DAS | Direct Attached Storage |
| DDR | Double-Data-Rate |
| DES | Data Encryption Standard |
| DMA | Direct Memory Access |
| DNA | Direct NAND Access |
| DRAM | Dynamic Random Access Memory |
| DVD | Digital Versatile/Video Disk |
| DVR | Digital Video Recorder |
| DVT | Design Verification Test |
| ECC | Error-Correcting Code |
| eMMC | Embedded MultiMediaCard |
| eSATA | external Serial Advanced Technology Attachment |
| EVT | enVironmental Design Testing |
| FLM | First Level Map |
| FUA | Force Unit Access |
| GPS | Global Positioning System |
| GUI | Graphical User Interface |
| HBA | Host Bus Adapter |
| HDD | Hard Disk Drive |
| I/O | Input/Output |
| IC | Integrated Circuit |
| IDE | Integrated Drive Electronics |
| JPEG | Joint Photographic Experts Group |
| LAN | Local Area Network |
| LB | Logical Block |
| LBA | Logical Block Address |
| LDPC | Low-Density Parity-Check |
| LED | Light Emitting Diode |
| LPN | Logical Page Number |
| LZ | Lempel-Ziv |
| MAC | Media Access Control |

-continued

| Acronym | Description |
|---|---|
| MLC | Multi-Level Cell |
| MMC | MultiMediaCard |
| MPEG | Moving Picture Experts Group |
| MRAM | Magnetic Random Access Memory |
| MST | Manufacturing Self Test |
| NAS | Network Attached Storage |
| NCQ | Native Command Queuing |
| NVM | Non-Volatile Memory |
| OEM | Original Equipment Manufacturer |
| ONA | Optimized NAND Access |
| ONFI | Open NAND Flash Interface |
| OS | Operating System |
| PC | Personal Computer |
| PCIe | Peripheral Component Interconnect express (PCI express) |
| PDA | Personal Digital Assistant |
| PHY | PHYsical interface |
| POS | Point Of Sale |
| RAID | Redundant Array of Inexpensive/Independent Disks |
| RDT | Reliability Demonstration Test |
| RMA | Return Material Authorization |
| RS | Reed-Solomon |
| RSA | Rivest, Shamir & Adleman |
| SAN | Storage Attached Network |
| SAS | Serial Attached Small Computer System Interface (Serial SCSI) |
| SATA | Serial Advanced Technology Attachment (Serial ATA) |
| SCSI | Small Computer System Interface |
| SCT | SMART Command Transport |
| SD | Secure Digital |
| SDR | Single-Data-Rate |
| SLC | Single-Level Cell |
| SLM | Second-Level Map |
| SMART | Self-Monitoring Analysis and Reporting Technology |
| SPB | Secure Physical Boundary |
| SRAM | Static Random Access Memory |
| SSD | Solid-State Disk/Drive |
| SSP | Software Settings Preservation |
| UFS | Unified Flash Storage |
| USB | Universal Serial Bus |
| VF | Virtual Function |
| VPD | Vital Product Data |
| WAN | Wide Area Network |
| WWN | World Wide Name |
| XML | eXtensible Markup Language |

An SSD MST capability enables an SSD manufacturer to define and prepare tests for an SSD, run the tests on production instances of the SSDs, and gather results of the running after completion of the tests. The manufacturer creates the tests without any specific knowledge of internal operation of the SSD (such as how elements of the test are implemented by the SSD), and customizes the tests according to targeted production and/or quality assurance requirements. The tests optionally embody, as defined by the manufacturer, one or more of: test parameters, sequences, and exit criteria. The tests are in addition to optional predefined and/or built-in tests implemented by the SSD (e.g. as activated by a storage interface protocol such as an ATA SMART protocol).

The defining and the preparing of the tests include generating a test script and loading the script onto the production SSDs. The running includes powering up the production SSDs and the production SSDs self executing the loaded script. The powering up and self executing are, e.g., while coupled to a host that loaded the script, while coupled to a rack unable to load the script into the SSD but enabled to provide power to the SSD, or while coupled to some other component enabled to provide power. The rack is optionally cost-reduced to enable cost-efficient parallel testing of relatively larger numbers of SSDs for production. The result gathering includes reading results of the self executing (e.g. an event log and bad block information) and readying the production SSDs for customer use. The readying includes securely erasing the production SSDs, clearing some of the results (e.g. the event log), and leaving intact some of the results (e.g., bad block information).

The SSD is enabled to receive the tests (e.g. via the host writing an 'input' SMART log of the SSD), to execute commands of the tests (e.g. via firmware reading the commands from the input SMART log), and to provide the results (e.g. via the firmware writing to an 'output' SMART log of the SSD). The SSD is enabled to perform the receiving, the executing, and the providing via any one or more of hardware, software, and firmware. The commands include write drive, erase drive, SATA PHY burn-in, delay, and stress mode. Any one or more of the commands (sometimes referred to as 'primitives') have zero or more parameters, e.g., to specify operation of the command.

In some embodiments and/or usage scenarios, the SSD MST capability is used in conjunction with an SSD virtual manufacturing model. In some instances, the SSD MST capability is used by a system vendor that is manufacturing SSDs (e.g. in a context of the system vendor using a virtual drive manufacturing model).

A virtual drive manufacturing model enables a system vendor to directly procure selected materials, such as memory devices, for manufacture of storage devices. The direct procurement eliminates a margin mark-up (e.g. margin stacking) on the selected materials compared to techniques where the system vendor procures the storage devices (using the selected materials) from a storage device vendor. In addition to memory devices, other example selected materials include power supplies, temperature sensors, casings, printed circuit boards, and passive components. For a specific example, the selected materials are memory devices such as NVM, e.g., flash memory devices, and the storage devices are SSDs. A design vendor implements an SSD controller and associated firmware, along with a reference design, a list of recommended and/or supported flash memory devices for use in the reference design with the SSD controller, and optionally manufacturing software enabling volume production of storage devices built using the SSD controller. The design vendor optionally and/or selectively provides marketing collateral, engineering information, engineering samples, the manufacturing software, and/or test/qualification services to the system vendor to enable the system vendor to directly (or indirectly) perform volume production of SSDs in accordance with the reference design, using the SSD controller, the firmware, flash memory devices from the list, and other materials.

In various embodiments and/or usage scenarios, the SSD controller and/or the firmware implemented by the design vendor are enabled to operate with flash memory devices from a plurality of flash memory vendors. The operation with flash memory devices from a plurality of flash memory vendors is enabled via, for example, varying operation of interface protocols, read, write, and/or erase techniques, parameters, and/or characteristics according to flash memory device used. The operation with flash memory devices from a plurality of flash memory vendors is enabled further via, for another example, management algorithms managing the flash memory devices in accordance with a variety of error recovery codes.

In various embodiments and/or usage scenarios, the SSD controller and/or the firmware implemented by the design vendor are enabled to operate with host LBs of various sized quanta, enabling SSD products operable with a variety of LB sizes such as for enterprise and/or cloud usage scenarios as well as SSD products operable with a single LB size such as for industrial and/or client usage scenarios. In various embodiments and/or usage scenarios, the SSD controller and/or the firmware implemented by the design vendor are enabled to implement SSDs of varying capacities, such as for enterprise, cloud, industrial, and/or client usage scenarios.

In some embodiments, an I/O device, such as an SSD, includes an SSD controller. The SSD controller acts as a bridge between the host interface and NVM of the SSD, and executes commands of a host protocol sent from a computing host via a host interface of the SSD. At least some of the commands direct the SSD to write and read the NVM with data sent from and to the computing host, respectively. In further embodiments, the SSD controller is enabled to use a map to translate between LBAs of the host protocol and physical storage addresses in the NVM. In further embodiments, at least a portion of the map is used for private storage (not visible to the computing host) of the I/O device. For example, a portion of the LBAs not accessible by the computing host is used by the I/O device to manage access to logs, statistics, or other private data.

According to various embodiments, the map is one or more of: a one-level map; a two-level map; a multi-level map; a direct map; an associative map; and any other means of associating the LBAs of the host protocol with the physical storage addresses in the NVM. For example, in some embodiments, a two-level map includes a first-level map that associates a first function of an LBA with a respective address in the NVM of one of a plurality of second-level map pages, and each of the second-level map pages associates a second function of the LBA with a respective address in the NVM of data corresponding to the LBA. In further embodiments, an example of the first function of the LBA and the second function of the LBA are a quotient and a remainder obtained when dividing by a fixed number of entries included in each of the second-level map pages. The plurality of second-level map pages is collectively termed a second-level map. Herein, references to one or more entries of a map refers to one or more entries of any type of map, including a one-level map, a first-level of a two-level map, a second-level of a two-level map, any level of a multi-level map, or any other type of map having entries.

According to various embodiments, each of the map pages of a second-level map (or a lower-level of a multi-level map) one or more of: includes a same number of entries as others of the map pages; includes a different number of entries than at least some others of the map pages; includes entries of a same granularity as others of the map pages; includes entries of a different granularity than others of the map pages; includes entries that are all of a same granularity; includes entries that are of multiple granularities; includes a respective header specifying a format and/or layout of contents of the map page; and has any other format, layout, or organization to represent entries of the map page. For example, a first second-level map page has a specification of a granularity of 4 KB per entry, and a second second-level map page has a specification of a granularity of 8 KB per entry and only one half as many entries as the first second-level map page.

In further embodiments, entries of a higher-level map include the format and/or layout information of the corresponding lower-level map pages. For example, each of the entries in a first-level map includes a granularity specification for entries in the associated second-level map page.

In some embodiments, the map includes a plurality of entries, each of the entries associating one or more LBAs with information selectively including a respective location in the NVM where data of the LBAs is stored. For example, LBAs specify 512 B sectors, and each entry in the map is associated with an aligned eight-sector (4 KB) region of the LBAs.

According to various embodiments, the information of the entries of the map includes one or more of: a location in the NVM; an address of a read unit in the NVM; a number of read units to read to obtain data of associated LBAs stored in the NVM; a size of the data of the associated LBAs stored in the NVM, the size having a granularity that is optionally and/or selectively larger than one byte; an indication that the data of the associated LBAs is not present in the NVM, such as due to the data of the associated LBAs being trimmed; a property of the data of the associated LBAs; and any other meta-data, property, or nature of the data of the associated LBAs.

In some embodiments, addresses in the NVM are grouped into regions to reduce a number of bits required to represent one of the addresses. For example, if LBAs of the I/O device are divided into 64 regions, and the NVM is divided into 64 regions, one for each of the LBA regions, then a map entry associated with a particular LBA requires six fewer address bits since one of the regions in the NVM is able to be determined by the region of the particular LBA. According to various embodiments, an association between regions of the LBAs and regions of the NVM is by one or more of: equality; a direct association, such as 1-to-1 numeric function; a table look-up; a dynamic mapping; and any other method for associating two sets of numbers.

In various embodiments, the location in the NVM includes an address of one of a plurality of read units, and a length and/or a span in read units. The length is a size of a particular one of a plurality of data items stored in the NVM, the particular data item associated with the entry of the map including the length. According to various embodiments, the length has a granularity of one or more of: one byte; more than one byte; one read unit; a specified fraction of a read unit; a granularity according to a maximum allowed compression rate of one of the data items; and any other granularity used to track storage usage. The span is a number of read units, such as an integer number of read units, storing a respective portion of the particular data item. In further embodiments and/or usage scenarios, a first read unit in the span of read units and/or a last read unit in the span of read units optionally and/or selectively store some or all of multiple ones of the data items. In some embodiments and/or usage scenarios, the length and/or the span are stored encoded, such as by storing the length (sometimes termed size in a context with length and/or span encoded) as an offset from the span. In some embodiments and/or usage scenarios, unused encodings of the length and/or the span encode additional information, such as an indication as to whether an associated data item is present in the NVM.

Encoding the location in the NVM as an address and a length enables data stored in the NVM to vary in size. For example, a first 4 KB region is compressed to 400 B in size, is stored entirely in a single read unit (e.g. has a span of one read unit), and has a length of one read unit, whereas a second 4 KB region is incompressible, is stored entirely within more than one read unit (e.g. has a span of more than one read unit), and has a length of more than one read unit. For another example, a third 2 KB region is compressed to 1 KB in size, is stored spanning two read units (e.g. has a span of two read units), and has a length of one read unit, whereas a fourth 1 KB region is incompressible, but is stored within one read unit (e.g. has a span of one read unit), and has a length of one read unit. In further embodiments, having a length and/or span in read units of storage associated with a region of the LBAs enables reading solely a required portion of the NVM to retrieve data of the region of the LBAs.

In some embodiments, each of the entries of the map includes information, sometimes termed meta-data, specifying properties of a region of the LBAs associated with the entry. In further embodiments, at least some of the meta-data is of a granularity finer than that of the region, such as by having separate meta-data specifications for each of a plurality of LBAs of the region.

In some embodiments, accessing compressed data of varying-sized quanta in NVM provides improved storage efficiency in some usage scenarios. For example, an SSD controller receives (uncompressed) data from a computing host (e.g., relating to a disk write command), compresses the data, and stores the compressed data into flash memory. In response to a subsequent request from the computing host (e.g., relating to a disk read command), the SSD controller reads the compressed data from the flash memory, uncompresses the compressed data, and provides the uncompressed data to the computing host. The compressed data is stored in the flash memory according to varying-sized quanta, the quanta size varying due to, e.g., compression algorithm, operating mode, and compression effectiveness on various data. The SSD controller uncompresses the data in part by consulting an included map table to determine where header(s) are stored in the flash memory. The SSD controller parses the header(s) obtained from the flash memory to determine where appropriate (compressed) data is stored in the flash memory. The SSD controller uncompresses the appropriate data from the flash memory to produce the uncompressed data to provide to the computing host. In the instant application, uncompress (and variants thereof) is synonymous with decompress (and variants thereof).

In various embodiments, an SSD controller includes a host interface for interfacing with a computing host, an interface for interfacing with NVM such as flash memory, and circuitry for controlling the interfaces and performing (and/or controlling various aspects of the performing) compressing and uncompressing, as well as lower-level error correction, higher-level error correction, and dynamic higher-level redundancy mode management with independent silicon elements.

According to various embodiments, some host interfaces are compatible with one or more of a USB interface standard, a CF interface standard, an MMC interface standard, an eMMC interface standard, a Thunderbolt interface standard, a UFS interface standard, an SD interface standard, a Memory Stick interface standard, an xD-picture card interface standard, an IDE interface standard, a SATA interface standard, a SCSI interface standard, a SAS interface standard, and a PCIe interface standard. According to various embodiments, the computing host is all or any portions of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game. In some embodiments, an interfacing host (such as an SAS/SATA bridge) operates as a computing host and/or as a bridge to a computing host.

In various embodiments, the SSD controller includes one or more processors. The processors execute firmware to control and/or perform operation of the SSD controller. The SSD controller communicates with the computing host to send and receive commands and/or status as well as data. The computing host executes one or more of an operating system, a driver, and an application. Communication by the computing host with the SSD controller is optionally and/or selectively via the driver and/or via the application. In a first example, all communication to the SSD controller is via the driver, and the application provides higher-level commands to the driver that the driver translates into specific commands for the SSD controller. In a second example, the driver implements a bypass mode and the application is enabled to send specific commands to the SSD controller via the driver. In a third example, a PCIe SSD controller supports one or more Virtual Functions (VFs), enabling an application, once configured, to communicate directly with the SSD controller, bypassing the driver.

According to various embodiments, some SSDs are compatible with form-factors, electrical interfaces, and/or protocols used by magnetic and/or optical non-volatile storage, such as HDDs, CD drives, and DVD drives. In various embodiments, SSDs use various combinations of zero or more parity codes, zero or more RS codes, zero or more BCH codes, zero or more Viterbi or other trellis codes, and zero or more LDPC codes.

EXAMPLE EMBODIMENTS

In concluding the introduction to the detailed description, what follows is a collection of example embodiments, including at least some explicitly enumerated as "ECs" (Example Combinations), providing additional description of a variety of embodiment types in accordance with the concepts described herein; these examples are not meant to be mutually exclusive, exhaustive, or restrictive; and the invention is not limited to these example embodiments but rather encompasses all possible modifications and variations within the scope of the issued claims and their equivalents.

EC1) A method comprising:
  receiving one or more commands from a host, via a storage interface of a storage device coupled to the host, the commands being directed by the host to be stored in storage space of the storage device that is otherwise dedicated to storage of log information produced by the storage device;
  receiving an indicator to begin execution of the commands in response to an event; and
  executing the commands in response to the event.

EC2) The method of EC1, further comprising:
  providing a cryptographic key to a business to enable the business to decrypt firmware as one or more images from an encrypted firmware repository, the images being executable by processing elements of a storage device controller included in the storage device, the images enabling execution of the commands, the storage device being constructed in accordance with a storage device reference design;
  providing access to the encrypted firmware repository to the business;
  wherein the commands comprise a manufacturing self test of the storage device; and wherein the storage device comprises components selected from a list of components, the list being components that are compatible with the firmware, the storage device controller, and the storage device reference design.

EC3) The method of EC1, wherein:
the storage device comprises a storage device controller and storage media;
firmware compatible with the storage device controller is licensed to a business;
the storage device is constructed in accordance with a reference design and a list of candidate storage media devices provided to the business;
the storage media is comprised of elements selected by the business from the list;
the storage device controller in conjunction with the firmware is enabled to implement the storage device via the reference design and any members of the list;
the storage device controller in conjunction with the firmware is enabled to perform the executing; and
the executing performs a manufacturing self test of the storage device.

EC4) The method of EC1, further comprising storing one or more results produced by the executing.

EC5) The method of EC1, wherein the indicator is from the host and via the storage interface.

EC6) The method of EC1, wherein the storage space is otherwise dedicated to a Self-Monitoring Analysis and Reporting Technology (SMART) log.

EC7) The method of EC6, wherein the SMART log is a first SMART log and further comprising storing one or more results of the executing in a second SMART log.

EC8) The method of EC1, wherein the event is one of a plurality of events comprising a next power-on event and a start immediately event.

EC9) The method of EC1, wherein the two acts of receiving and the act of executing are performed at least in part by a controller of a Solid-State Disk (SSD).

EC10) The method of EC1, wherein the two acts of receiving and the act of executing are implemented at least in part by a storage device controller comprised in the storage device.

EC11) The method of EC10, wherein the storage device controller is implemented in a single Integrated Circuit (IC).

EC12) A method comprising:
receiving, via a storage interface of a storage device, an indicator to begin executing one or more commands stored in a first portion of a log storage space of a storage device;
executing the commands in response to the receiving of the indicator; and
storing one or more results produced by all or any portions the executing in a second portion of the log storage space.

EC13) The method of EC12, wherein the indicator is provided by a host coupled to the storage interface.

EC14) The method of EC12, wherein the log storage space is Self-Monitoring Analysis and Reporting Technology (SMART) log storage space compatible with access via a SMART log storage space read or write access received via the storage interface.

EC15) The method of EC12, wherein the acts of receiving, executing, and storing are performed at least in part by a controller of a Solid-State Disk (SSD).

EC16) A method comprising:
in a storage device, receiving information from a host via a storage interface of the storage device, the information comprising one or more commands compatible with performing at least a portion of a manufacturing self test of the storage device, the information further comprising a directive that the commands are to be stored in a first portion of a log storage of the storage device;
in the storage device, receiving an indicator from the host via the storage interface, the indicator being a signal to the storage device specifying when to begin execution of the commands stored in the first portion of the log storage;
in the storage device and in response to the receiving the indicator, executing the commands;
in the storage device, storing at least some results of the executing in a second portion of the log storage; and
wherein the log storage is Self-Monitoring Analysis and Reporting Technology (SMART) log storage accessible via SMART log storage access commands received via the storage interface.

EC17) The method of EC16, wherein the indicator indicates to begin the execution of the commands immediately and the storage device is coupled to the host at least in part during the executing.

EC18) The method of EC16, wherein the indicator indicates to begin the execution of the commands at a next power-on, the executing is further in response to the next power-on, and the storage device is uncoupled from the host at least in part during the executing.

EC19) The method of EC1, EC12, or EC16, wherein at least one of the commands directs the storage device to test storage media comprised in the storage device and that enables the storage device to store data received via the storage interface.

EC20) The method of EC1, EC12, or EC16, wherein the storage device comprises a Solid-State Disk (SSD) and the storage interface comprises a Serial Advanced Technology Attachment (SATA) interface.

EC21) The method of EC1, EC12, or EC16, wherein the indicator is a vendor-specific Self-Monitoring Analysis and Reporting Technology (SMART) Command Transport (SCT) command.

EC22) The method of EC1, EC12, or EC16, wherein the commands comprise any one or more of a write storage command, an erase storage command, a storage interface burn-in command, a delay command, a stress mode command, a loop command, and a conditional command.

EC23) The method of EC1, EC12, or EC16, wherein the commands comprise a series of one or more types of operations.

EC24) The method of EC23, wherein at least one of the types of operations specifies writing of storage media comprised in the storage device.

EC25) The method of EC23, wherein at least one of the types of operations specifies erasing of storage media comprised in the storage device.

EC26) The method of EC23, wherein at least one of the types of operations specifies verifying of storage media comprised in the storage device.

EC27) The method of EC23, wherein one or more of the types of operations comprises an address and a length associated with a portion of storage media comprised in the storage device of a size corresponding to the length.

EC28) The method of EC4, EC12, or EC16, wherein the results comprise any one or more of test state, one or more progress indicators, one or more statistics, and error information.

EC29) The method of EC28, wherein the test state comprises any one or more of not activated, activated, running, end of input, aborted, and error test states.

EC30) The method of EC28, wherein at least one of the progress indicators comprises any one or more of an input offset with respect to the commands, an indicator of a current one of the commands, a measure of a number of the commands completed, a measure of an amount of completion of any one or more of the commands, a measure of an amount of user data storage of the storage device remaining to be tested, a measure of an amount of the user data storage that has been tested, and a measure of elapsed time since beginning the executing.

EC31) The method of EC28, wherein at least one of the statistics comprise one or more of temperature of all or any portions of the storage device, bad portions of user data storage of the storage device, remapped portions of the user data storage, and error-free reads of the storage device.

EC32) The method of EC28, wherein the error information comprises one or more of correctable and/or uncorrectable errors, program errors, erase errors, bit error counts and/or types, and error events.

EC33) The method of EC1, EC12, or EC16 wherein the storage device implements mass storage at least in part via included one or more flash memory devices.

EC34) The method of EC33, wherein at least a portion of at least one of the flash memory devices comprises one or more of
NAND flash technology storage cells, and
NOR flash technology storage cells.

EC35) The method of EC33, wherein at least a portion of at least one of the flash memory devices comprises one or more of
Single-Level Cell (SLC) flash technology storage cells, and
Multi-Level Cell (MLC) flash technology storage cells.

EC36) The method of EC33, wherein at least a portion of at least one of the flash memory devices comprises one or more of
polysilicon technology-based charge storage cells, and
silicon nitride technology-based charge storage cells.

EC37) The method of EC33, wherein at least a portion of at least one of the flash memory devices comprises one or more of
two-dimensional technology-based flash memory technology, and
three-dimensional technology-based flash memory technology.

EC38) The method of EC33, wherein the storage device comprises a flash memory interface enabled to communicate data with at least one of the flash memory devices.

EC39) The method of EC38, wherein the flash memory interface is compatible with one or more of
an Open NAND Flash Interface (ONFI),
a Toggle-mode interface,
a Double-Data-Rate (DDR) synchronous interface,
a DDR2 synchronous interface;
a synchronous interface, and
an asynchronous interface.

EC40) The method of EC33, wherein the storage interface is compatible with a storage interface standard.

EC41) The method of EC40, wherein the storage interface standard comprises one or more of
a Universal Serial Bus (USB) interface standard,
a Compact Flash (CF) interface standard,
a MultiMediaCard (MMC) interface standard,
an embedded MMC (eMMC) interface standard,
a Thunderbolt interface standard,
a UFS interface standard,
a Secure Digital (SD) interface standard,
a Memory Stick interface standard,
an xD-picture card interface standard,
an Integrated Drive Electronics (IDE) interface standard,
a Serial Advanced Technology Attachment (SATA) interface standard,
an external SATA (eSATA) interface standard,
a Small Computer System Interface (SCSI) interface standard,
a Serial Attached Small Computer System Interface (SAS) interface standard,
a Fibre Channel interface standard,
an Ethernet interface standard, and
a Peripheral Component Interconnect express (PCIe) interface standard.

EC42) The method of EC1, EC13, or EC16, further comprising operating the host to provide the commands.

EC43) A storage device comprising:
firmware;
a processing element enabled to execute instructions of the firmware;
a storage interface enabled to receive, from a host coupled to the storage interface, one or more commands and an indicator to begin execution of the commands in response to an event;
storage space; and
wherein execution of one or more routines of the firmware by the processing element enables
storing the commands, as directed by the host, in a portion of the storage space that is otherwise dedicated to storage of log information produced by the storage device,
and executing the commands in response to the event.

EC44) The storage device of EC43, wherein the firmware, the processing element, the storage interface, and the storage space are comprised in a Solid-State Disk (SSD), and the storage interface comprises a Serial Advanced Technology Attachment (SATA) interface.

EC45) The storage device of EC43, wherein the storage space comprises a first Self-Monitoring Analysis and Reporting Technology (SMART) log and a second SMART log, the first SMART log comprises the portion, and the executing produces one or more results that are stored in the second SMART log.

EC46) A storage device comprising:
log storage space having first and second portions;
firmware;
a processing element enabled to execute instructions of the firmware;
a storage interface enabled to receive, from a host coupled to the storage interface, an indicator to begin execution of one or more commands stored in the first portion;
wherein execution of one or more routines of the firmware by the processing element enables
executing the commands in response to receiving the indicator, and
storing one or more results produced by all or any portions of the executing in the second portion.

EC47) The storage device of EC46, wherein the firmware, the processing element, the storage interface, and the log storage space are comprised in a Solid-State Disk (SSD), and the storage interface comprises a Serial Advanced Technology Attachment (SATA) interface.

EC48) The storage device of EC46, wherein the log storage space comprises first and second Self-Monitoring Analysis and Reporting Technology (SMART) logs, the first SMART log comprises the first portion, and the second SMART log comprises the second portion.

EC49) The storage device of EC43 or EC46, wherein the commands comprise any one or more of a write storage command, an erase storage command, a storage interface burn-in command, a delay command, a stress mode command, a loop command, and a conditional command.

EC50) The storage device of EC43 or EC46, further comprising storage media; and wherein the commands comprise a series of one or more types of operations, and any one or more of the operations comprise specifying any one or more of writing, erasing, and verifying of the storage media.

EC51) A tangible computer readable medium having a set of instructions stored therein that when executed by a processing element of a storage device cause the processing element to perform operations comprising:

managing receiving one or more commands from a host coupled to the storage device via a storage interface of the storage device, the commands being directed by the host to be stored in a portion of storage space of the storage device that is otherwise dedicated to storage of log information produced by the storage device;

recognizing an indicator to begin execution of the commands in response to an event; and executing the commands in response to the event.

EC52) The tangible computer readable medium of EC51, wherein the storage space comprises a first Self-Monitoring Analysis and Reporting Technology (SMART) log and a second SMART log, the first SMART log comprises the portion, and the executing the commands produces one or more results that are stored in the second SMART log.

EC53) A tangible computer readable medium having a set of instructions stored therein that when executed by a processing element of a storage device cause the processing element to perform operations comprising:

managing receiving, via a storage interface of the storage device, an indicator to begin executing one or more commands stored in a first portion of a log storage space of the storage device;

executing the commands in response to the receiving of the indicator; and storing one or more results produced by all or any portions the executing the commands in a second portion of the log storage space.

EC54) The tangible computer readable medium of EC53, wherein the log storage space comprises first and second Self-Monitoring Analysis and Reporting Technology (SMART) logs, the first SMART log comprises the first portion, and the second SMART log comprises the second portion.

EC55) The tangible computer readable medium of EC51 or EC53, wherein the commands comprise any one or more of a write storage command, an erase storage command, a storage interface burn-in command, a delay command, a stress mode command, a loop command, and a conditional command.

EC56) The tangible computer readable medium of EC51 or EC53, wherein the storage device comprises storage media, the commands comprise a series of one or more types of operations, and any one or more of the operations comprise specifying any one or more of writing, erasing, and verifying of the storage media.

EC57) A system comprising:

means for receiving one or more commands from a host, via a storage interface of a storage device coupled to the host, the commands being directed by the host to be stored in a portion of storage space of the storage device that is otherwise dedicated to storage of log information produced by the storage device;

means for receiving an indicator to begin execution of the commands in response to an event; and means for executing the commands in response to the event.

EC58) The system of EC57, wherein the means for receiving the commands, the means for receiving the indicator, and the means for executing are comprised in a Solid-State Disk (SSD), and the storage interface comprises a Serial Advanced Technology Attachment (SATA) interface.

EC59) A system comprising:

means for receiving, by a storage device and via a storage interface of the storage device, an indicator to begin executing one or more commands stored in a first portion of a log storage space of a storage device;

means for executing the commands responsive to the means for receiving; and means for storing, in a second portion of the log storage space, one or more results produced by all or any portions the means for executing.

EC60) The system of EC59, wherein the means for receiving, the means for executing, and the means for storing are comprised in a Solid-State Disk (SSD), and the storage interface comprises a Serial Advanced Technology Attachment (SATA) interface.

EC61) The system of EC57 or EC59, wherein the commands comprise any one or more of a write storage command, an erase storage command, a storage interface burn-in command, a delay command, a stress mode command, a loop command, and a conditional command.

EC62) The system of EC57 or EC59, further comprising storage media; and wherein the commands comprise a series of one or more types of operations, and any one or more of the operations comprise specifying any one or more of writing, erasing, and verifying of the storage media.

System

FIG. 1A illustrates selected details of an embodiment of a Solid-State Disk (SSD) including an SSD controller compatible for use with an SSD MST. The SSD controller is for managing non-volatile storage, such as implemented via NVM elements (e.g., flash memories). SSD Controller 100 is communicatively coupled via one or more External Interfaces 110 to a host (not illustrated). According to various embodiments, External Interfaces 110 are one or more of: a SATA interface; a SAS interface; a PCIe interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, SSD Controller 100 includes a SATA interface and a PCIe interface.

SSD Controller 100 is further communicatively coupled via one or more Device Interfaces 190 to NVM 199 including one or more storage devices, such as one or more of Flash Device 192. According to various embodiments, Device Interfaces 190 are one or more of: an asynchronous interface; a synchronous interface; a single-data-rate (SDR) interface; a double-data-rate (DDR) interface; a DRAM-compatible DDR or DDR2 synchronous interface; an ONFI compatible interface, such as an ONFI 2.2 or ONFI 3.0 compatible interface; a Toggle-mode compatible flash interface; a non-standard version of any of the preceding interfaces; a custom interface; or any other type of interface used to connect to storage devices.

Each Flash Device 192 has, in some embodiments, one or more individual Flash Die 194. According to type of a particular one of Flash Device 192, a plurality of Flash Die 194 in the particular Flash Device 192 is optionally and/or selectively accessible in parallel. Flash Device 192 is merely representative of one type of storage device enabled to communicatively couple to SSD Controller 100. In various embodiments, any type of storage device is usable, such as an SLC NAND flash memory, MLC NAND flash memory, NOR flash memory, flash memory using polysilicon or silicon nitride technology-based charge storage cells, two- or three-dimensional technology-based flash memory, read-only memory, static random access memory, dynamic random access memory, ferromagnetic memory, phase-change memory, racetrack memory, or any other type of memory device or storage medium.

According to various embodiments, Device Interfaces 190 are organized as: one or more busses with one or more of Flash Device 192 per bus; one or more groups of busses with one or more of Flash Device 192 per bus, where busses in a group are generally accessed in parallel; or any other organization of one or more of Flash Device 192 onto Device Interfaces 190.

Continuing in FIG. 1A, SSD Controller 100 has one or more modules, such as Host Interfaces 111, Data Processing 121, Buffer 131, Map 141, Recycler 151, ECC 161, Device Interface Logic 191, and CPU 171. The specific modules and interconnections illustrated in FIG. 1A are merely representative of one embodiment, and many arrangements and interconnections of some or all of the modules, as well as additional modules not illustrated, are conceived. In a first example, in some embodiments, there are two or more Host Interfaces 111 to provide dual-porting. In a second example, in some embodiments, Data Processing 121 and/or ECC 161 are combined with Buffer 131. In a third example, in some embodiments, Host Interfaces 111 is directly coupled to Buffer 131, and Data Processing 121 optionally and/or selectively operates on data stored in Buffer 131. In a fourth example, in some embodiments, Device Interface Logic 191 is directly coupled to Buffer 131, and ECC 161 optionally and/or selectively operates on data stored in Buffer 131.

Host Interfaces 111 sends and receives commands and/or data via External Interfaces 110, and, in some embodiments, tracks progress of individual commands via Tag Tracking 113. For example, the commands include a read command specifying an address (such as an LBA) and an amount of data (such as a number of LBA quanta, e.g., sectors) to read; in response the SSD provides read status and/or read data. For another example, the commands include a write command specifying an address (such as an LBA) and an amount of data (such as a number of LBA quanta, e.g., sectors) to write; in response the SSD provides write status and/or requests write data and optionally subsequently provides write status. For yet another example, the commands include a de-allocation command (e.g. a trim command) specifying one or more addresses (such as one or more LBAs) that no longer need be allocated; in response the SSD modifies the map accordingly and optionally provides de-allocation status. In some contexts an ATA compatible TRIM command is an exemplary de-allocation command. For yet another example, the commands include a super capacitor test command or a data hardening success query; in response, the SSD provides appropriate status. In some embodiments, Host Interfaces 111 is compatible with a SATA protocol and, using NCQ commands, is enabled to have up to 32 pending commands, each with a unique tag represented as a number from 0 to 31. In some embodiments, Tag Tracking 113 is enabled to associate an external tag for a command received via External Interfaces 110 with an internal tag used to track the command during processing by SSD Controller 100.

According to various embodiments, one or more of: Data Processing 121 optionally and/or selectively processes some or all data sent between Buffer 131 and External Interfaces 110; and Data Processing 121 optionally and/or selectively processes data stored in Buffer 131. In some embodiments, Data Processing 121 uses one or more Engines 123 to perform one or more of: formatting; reformatting; transcoding; and any other data processing and/or manipulation task.

Buffer 131 stores data sent to/from External Interfaces 110 from/to Device Interfaces 190. In some embodiments, Buffer 131 additionally stores system data, such as some or all map tables, used by SSD Controller 100 to manage one or more of Flash Device 192. In various embodiments, Buffer 131 has one or more of: Memory 137 used for temporary storage of data; DMA 133 used to control movement of data to and/or from Buffer 131; and ECC-X 135 used to provide higher-level error correction and/or redundancy functions; and other data movement and/or manipulation functions. An example of a higher-level redundancy function is a RAID-like capability, where redundancy is at a flash device (e.g., multiple ones of Flash Device 192) level and/or a flash die (e.g., Flash Die 194) level instead of at a disk level.

According to various embodiments, one or more of: ECC 161 optionally and/or selectively processes some or all data sent between Buffer 131 and Device Interfaces 190; and ECC 161 optionally and/or selectively processes data stored in Buffer 131. In some embodiments, ECC 161 is used to provide lower-level error correction and/or redundancy functions, such as in accordance with one or more ECC techniques. In some embodiments, ECC 161 implements one or more of: a CRC code; a Hamming code; an RS code; a BCH code; an LDPC code; a Viterbi code; a trellis code; a hard-decision code; a soft-decision code; an erasure-based code; any error detecting and/or correcting code; and any combination of the preceding. In some embodiments, ECC 161 includes one or more decoders (such as LDPC decoders).

Device Interface Logic 191 controls instances of Flash Device 192 via Device Interfaces 190. Device Interface Logic 191 is enabled to send data to/from the instances of Flash Device 192 according to a protocol of Flash Device 192. Device Interface Logic 191 includes Scheduling 193 to selectively sequence control of the instances of Flash Device 192 via Device Interfaces 190. For example, in some embodiments, Scheduling 193 is enabled to queue operations to the instances of Flash Device 192, and to selectively send the operations to individual ones of the instances of Flash Device 192 (or Flash Die 194) as individual ones of the instances of Flash Device 192 (or Flash Die 194) are available.

Map 141 converts between data addressing used on External Interfaces 110 and data addressing used on Device Interfaces 190, using Table 143 to map external data addresses to locations in NVM 199. For example, in some embodiments, Map 141 converts LBAs used on External Interfaces 110 to block and/or page addresses targeting one or more Flash Die 194, via mapping provided by Table 143. For LBAs that have never been written since drive manufacture or de-allocation, the map points to a default value to return if the LBAs are read. For example, when processing a de-allocation command, the map is modified so that entries corresponding to the de-allocated LBAs point to one of the default values. In various embodiments, there are various default values, each having a corresponding pointer. The plurality of default values enables reading some de-allocated LBAs (such as in a first range) as one default value, while reading other de-allocated LBAs (such as in a second range) as another default value. The default values, in various embodiments, are defined by flash memory, hardware, firmware, command and/or primitive arguments and/or parameters, programmable registers, or various combinations thereof.

In some embodiments, Map 141 uses Table 143 to perform and/or to look up translations between addresses used on External Interfaces 110 and data addressing used on Device Interfaces 190. According to various embodiments, Table 143 is one or more of: a one-level map; a two-level map; a multi-level map; a map cache; a compressed map; any type of mapping from one address space to another; and any combination of the foregoing. According to various embodiments, Table 143 includes one or more of: static random access memory; dynamic random access memory; NVM (such as flash memory); cache memory; on-chip memory; off-chip memory; and any combination of the foregoing.

In some embodiments, Recycler 151 performs garbage collection. For example, in some embodiments, instances of Flash Device 192 contain blocks that must be erased before the blocks are re-writeable. Recycler 151 is enabled to determine which portions of the instances of Flash Device 192 are actively in use (e.g., allocated instead of de-allocated), such as by scanning a map maintained by Map 141, and to make unused (e.g., de-allocated) portions of the instances of Flash Device 192 available for writing by erasing them. In further embodiments, Recycler 151 is enabled to move data stored within instances of Flash Device 192 to make larger contiguous portions of the instances of Flash Device 192 available for writing.

In some embodiments, instances of Flash Device 192 are selectively and/or dynamically configured, managed, and/or used to have one or more bands for storing data of different types and/or properties. A number, arrangement, size, and type of the bands are dynamically changeable. For example, data from a computing host is written into a hot (active) band, while data from Recycler 151 is written into a cold (less active) band. In some usage scenarios, if the computing host writes a long, sequential stream, then a size of the hot band grows, whereas if the computing host does random writes or few writes, then a size of the cold band grows.

CPU 171 controls various portions of SSD Controller 100. CPU 171 includes CPU Core 172. CPU Core 172 is, according to various embodiments, one or more single-core or multi-core processors. The individual processors cores in CPU Core 172 are, in some embodiments, multi-threaded. CPU Core 172 includes instruction and/or data caches and/or memories. For example, the instruction memory contains instructions to enable CPU Core 172 to execute programs (e.g. software sometimes called firmware) to control SSD Controller 100. In some embodiments, some or all of the firmware executed by CPU Core 172 is stored on instances of Flash Device 192 (as illustrated, e.g., as Firmware 106 of NVM 199 in FIG. 1B).

In various embodiments, CPU 171 further includes: Command Management 173 to track and control commands received via External Interfaces 110 while the commands are in progress; Buffer Management 175 to control allocation and use of Buffer 131; Translation Management 177 to control Map 141; Coherency Management 179 to control consistency of data addressing and to avoid conflicts such as between external data accesses and recycle data accesses; Device Management 181 to control Device Interface Logic 191; Identity Management 182 to control modification and communication of identify information, and optionally other management units. None, any, or all of the management functions performed by CPU 171 are, according to various embodiments, controlled and/or managed by hardware, by software (such as firmware executing on CPU Core 172 or on a host connected via External Interfaces 110), or any combination thereof.

In some embodiments, CPU 171 is enabled to perform other management tasks, such as one or more of: gathering and/or reporting performance statistics; implementing SMART; controlling power sequencing, controlling and/or monitoring and/or adjusting power consumption; responding to power failures; controlling and/or monitoring and/or adjusting clock rates; and other management tasks.

Various embodiments include a computing-host flash memory controller that is similar to SSD Controller 100 and is compatible with operation with various computing hosts, such as via adaptation of Host Interfaces 111 and/or External Interfaces 110. The various computing hosts include one or any combination of a computer, a workstation computer, a server computer, a storage server, a SAN, a NAS device, a DAS device, a storage appliance, a PC, a laptop computer, a notebook computer, a netbook computer, a tablet device or computer, an ultrabook computer, an electronic reading device (such as an e-reader), a PDA, a navigation system, a (handheld) GPS device, an automotive control system, an automotive media control system or computer, a printer, copier or fax machine or all-in-one device, a POS device, a cash-register, a media player, a television, a media recorder, a DVR, a digital camera, a cellular handset, a cordless telephone handset, and an electronic game.

In various embodiments, all or any portions of an SSD controller (or a computing-host flash memory controller) are implemented on a single IC, a single die of a multi-die IC, a plurality of dice of a multi-die IC, or a plurality of ICs. For example, Buffer 131 is implemented on a same die as other elements of SSD Controller 100. For another example, Buffer 131 is implemented on a different die than other elements of SSD Controller 100.

Figure 1B:
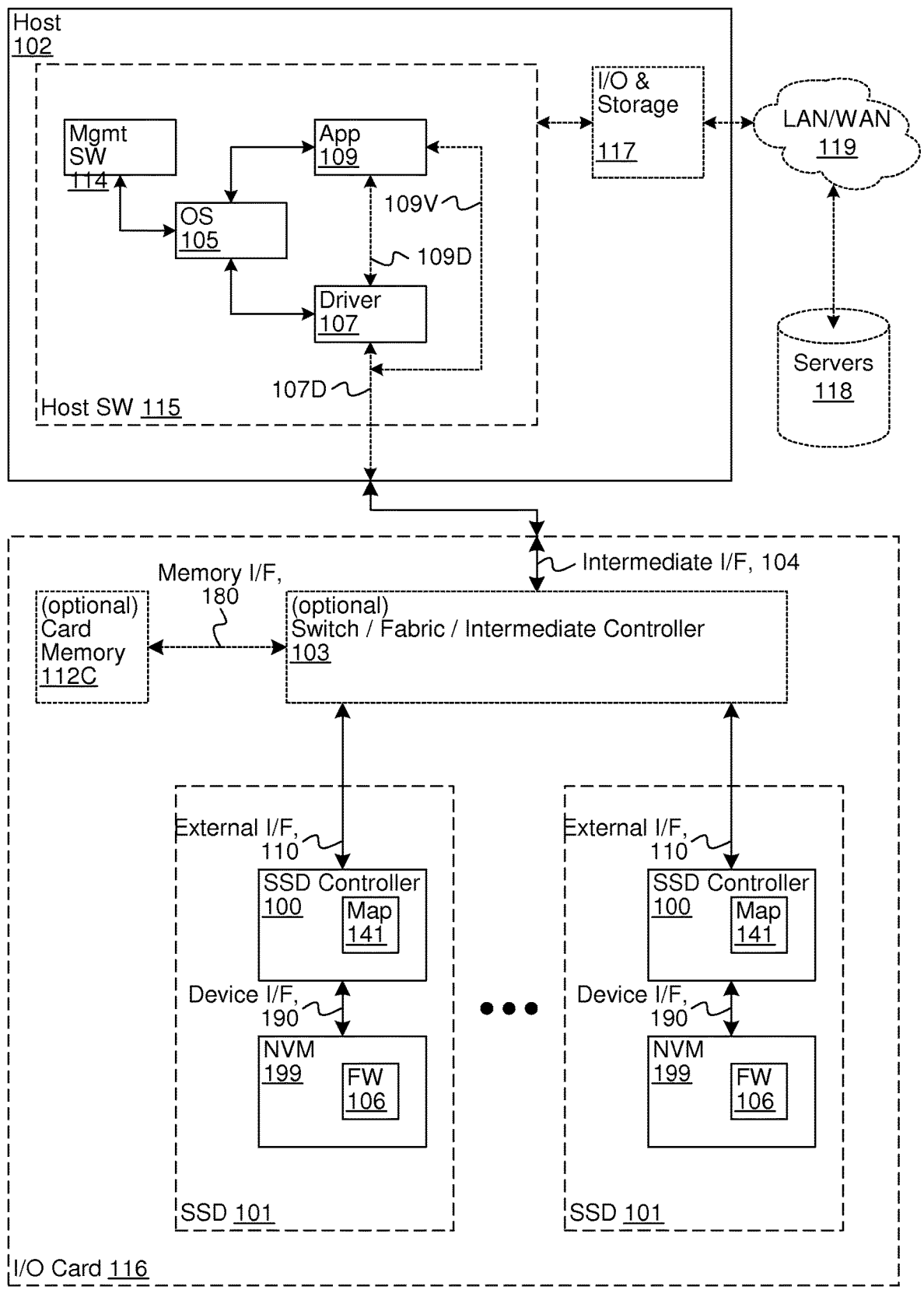
FIG. 1B illustrates selected details of various embodiments of systems including one or more instances of the SSD of FIG. 1A.

FIG. 1B illustrates selected details of various embodiments of systems including one or more instances of the SSD of FIG. 1A. SSD 101 includes SSD Controller 100 coupled to NVM 199 via Device Interfaces 190. The figure illustrates various classes of embodiments: a single SSD coupled directly to a host, a plurality of SSDs each respectively coupled directly to a host via respective external interfaces, and one or more SSDs coupled indirectly to a host via various interconnection elements.

As an example embodiment of a single SSD coupled directly to a host, one instance of SSD 101 is coupled directly to Host 102 via External Interfaces 110 (e.g. Switch/Fabric/Intermediate Controller 103 is omitted, bypassed, or passed-through). As an example embodiment of a plurality of SSDs each coupled directly to a host via respective external interfaces, each of a plurality of instances of SSD 101 is respectively coupled directly to Host 102 via a respective instance of External Interfaces 110 (e.g. Switch/Fabric/Intermediate Controller 103 is omitted, bypassed, or passed-through). As an example embodiment of one or more SSDs coupled indirectly to a host via various interconnection elements, each of one or more instances of SSD 101 is respectively coupled indirectly to Host 102. Each indirect coupling is via a respective instance of External Interfaces 110 coupled to Switch/Fabric/Intermediate Controller 103, and Intermediate Interfaces 104 coupling to Host 102.

Some of the embodiments including Switch/Fabric/Intermediate Controller 103 also include Card Memory 112C coupled via Memory Interface 180 and accessible by the SSDs. In various embodiments, one or more of the SSDs, the Switch/Fabric/Intermediate Controller, and/or the Card Memory are included on a physically identifiable module, card, or pluggable element (e.g. I/O Card 116). In some embodiments, SSD 101 (or variations thereof) corresponds to a SAS drive or a SATA drive that is coupled to an initiator operating as Host 102.

Host 102 is enabled to execute various elements of Host Software 115, such as various combinations of OS 105, Driver 107, Application 109, and Multi-Device Management Software 114. Dotted-arrow 107D is representative of Host Software ←→ I/O Device Communication, e.g. data sent/received to/from one or more of the instances of SSD 101 and from/to any one or more of OS 105 via Driver 107, Driver 107, and Application 109, either via Driver 107, or directly as a VF.

OS 105 includes and/or is enabled to operate with drivers (illustrated conceptually by Driver 107) for interfacing with the SSD. Various versions of Windows (e.g. 95, 98, ME, NT, XP, 2000, Server, Vista, and 7), various versions of Linux (e.g. Red Hat, Debian, and Ubuntu), and various versions of MacOS (e.g. 8, 9 and X) are examples of OS 105. In various embodiments, the drivers are standard and/or generic drivers (sometimes termed "shrink-wrapped" or "pre-installed") operable with a standard interface and/or protocol such as SATA, AHCI, or NVM Express, or are optionally customized and/or vendor specific to enable use of commands specific to SSD 101. Some drives and/or drivers have pass-through modes to enable application-level programs, such as Application 109 via Optimized NAND Access (sometimes termed ONA) or Direct NAND Access (sometimes termed DNA) techniques, to communicate commands directly to SSD 101, enabling a customized application to use commands specific to SSD 101 even with a generic driver. ONA techniques include one or more of: use of non-standard modifiers (hints); use of vendor-specific commands; communication of non-standard statistics, such as actual NVM usage according to compressibility; and other techniques. DNA techniques include one or more of: use of non-standard commands or vendor-specific providing unmapped read, write, and/or erase access to the NVM; use of non-standard or vendor-specific commands providing more direct access to the NVM, such as by bypassing formatting of data that the I/O device would otherwise do; and other techniques. Examples of the driver are a driver without ONA or DNA support, an ONA-enabled driver, a DNA-enabled driver, and an ONA/DNA-enabled driver. Further examples of the driver are a vendor-provided, vendor-developed, and/or vendor-enhanced driver, and a client-provided, client-developed, and/or client-enhanced driver.

Examples of the application-level programs are an application without ONA or DNA support, an ONA-enabled application, a DNA-enabled application, and an ONA/DNA-enabled application. Dotted-arrow 109D is representative of Application ←→ I/O Device Communication (e.g. bypass via a driver or bypass via a VF for an application), e.g. an ONA-enabled application and an ONA-enabled driver communicating with an SSD, such as without the application using the OS as an intermediary. Dotted-arrow 109V is representative of Application ←→ I/O Device Communication (e.g. bypass via a VF for an application), e.g. a DNA-enabled application and a DNA-enabled driver communicating with an SSD, such as without the application using the OS or the driver as intermediaries.

One or more portions of NVM 199 are used, in some embodiments, for firmware storage, e.g. Firmware 106. The firmware storage includes one or more firmware images (or portions thereof). A firmware image has, for example, one or more images of firmware, executed, e.g., by CPU Core 172 of SSD Controller 100. A firmware image has, for another example, one or more images of constants, parameter values, and NVM device information, referenced, e.g. by the CPU core during the firmware execution. The images of firmware correspond, e.g., to a current firmware image and zero or more previous (with respect to firmware updates) firmware images. In various embodiments, the firmware provides for generic, standard, ONA, and/or DNA operating modes. In some embodiments, one or more of the firmware operating modes are enabled (e.g. one or more APIs are "unlocked") via keys or various software techniques, optionally communicated and/or provided by a driver.

In some embodiments lacking the Switch/Fabric/Intermediate Controller, the SSD is coupled to the host directly via External Interfaces 110. In various embodiments, SSD Controller 100 is coupled to the host via one or more intermediate levels of other controllers, such as a RAID controller. In some embodiments, SSD 101 (or variations thereof) corresponds to a SAS drive or a SATA drive and Switch/Fabric/Intermediate Controller 103 corresponds to an expander that is in turn coupled to an initiator, or alternatively Switch/Fabric/Intermediate Controller 103 corresponds to a bridge that is indirectly coupled to an initiator via an expander. In some embodiments, Switch/Fabric/Intermediate Controller 103 includes one or more PCIe switches and/or fabrics.

In various embodiments, such as some of the embodiments where Host 102 is a computing host (e.g. a computer, a workstation computer, a server computer, a storage server, a SAN, a NAS device, a DAS device, a storage appliance, a PC, a laptop computer, a notebook computer, and/or a netbook computer), the computing host is optionally enabled to communicate (e.g. via optional I/O & Storage Devices/Resources 117 and optional LAN/WAN 119) with one or more local and/or remote servers (e.g. optional Servers 118). The communication enables, for example, local and/or remote access, management, and/or usage of any one or more of SSD 101 elements. In some embodiments, the communication is wholly or partially via Ethernet. In some embodiments, the communication is wholly or partially via Fibre Channel. LAN/WAN 119 is representative, in various embodiments, of one or more Local and/or Wide Area Networks, such as any one or more of a network in a server farm, a network coupling server farms, a metro-area network, and the Internet.

In various embodiments, an SSD controller and/or a computing-host flash memory controller in combination with one or more NVMs are implemented as a non-volatile storage component, such as a USB storage component, a CF storage component, an MMC storage component, an eMMC storage component, a Thunderbolt storage component, a UFS storage component, an SD storage component, a Memory Stick storage component, and an xD-picture card storage component.

In various embodiments, all or any portions of an SSD controller (or a computing-host flash memory controller), or functions thereof, are implemented in a host that the controller is to be coupled with (e.g., Host 102 of FIG. 1B). In various embodiments, all or any portions of an SSD controller (or a computing-host flash memory controller), or functions thereof, are implemented via hardware (e.g., logic circuitry), software and/or firmware (e.g., driver software or SSD control firmware), or any combination thereof. For example, functionality of or associated with an ECC unit (such as similar to ECC 161 and/or ECC-X 135 of FIG. 1A) is implemented partially via software on a host and partially via a combination of firmware and hardware in an SSD controller. For another example, functionality of or associated with a recycler unit (such as similar to Recycler 151 of FIG. 1A) is implemented partially via software on a host and partially via hardware in a computing-host flash memory controller.

Mapping Operation

Figure 2:
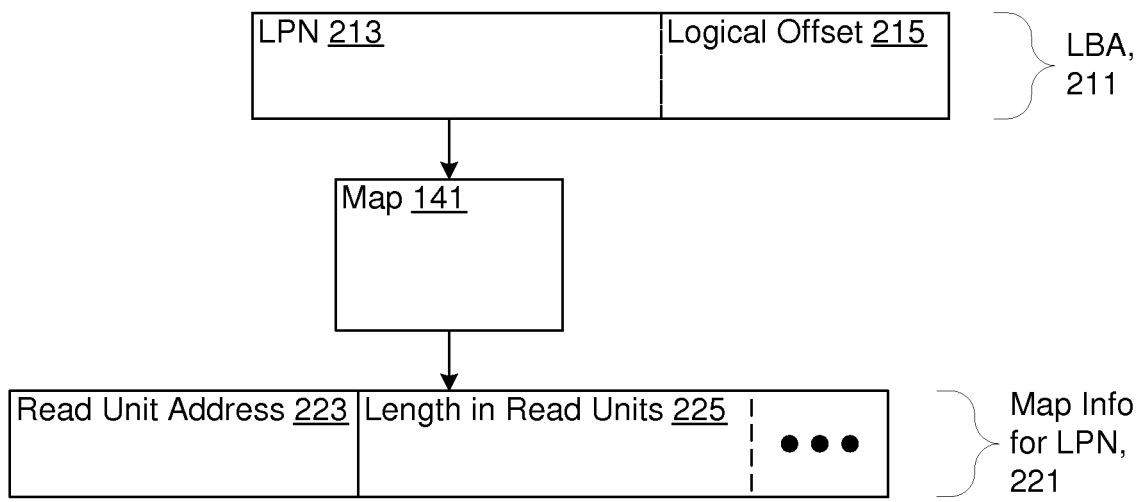
FIG. 2 illustrates selected details of an embodiment of mapping a Logical Page Number (LPN) portion of a Logical Block Address (LBA).

FIG. 2 illustrates selected details of an embodiment of mapping an LPN portion of an LBA. In some embodiments, a read unit is a finest granularity of an NVM that is independently readable, such as a portion of a page of the NVM. In further embodiments, the read unit corresponds to check bits (sometimes-termed redundancy) of a (lower-level) error-correcting code along with all data protected by the check bits. For example, ECC 161 of FIG. 1A implements error correction via check bits such as via an LDPC code, and a read unit corresponds to coding bits implementing the LDPC code in addition to data bits protected by the LDPC coding bits.

In some embodiments, Map 141 maps LPN 213 portion of LBA 211 to Map Info for LPN 221, such as via Table 143 (as illustrated in FIG. 1A). Map info for an LPN (such as Map Info for LPN 221) is sometimes termed a map entry. Map 141 is said to associate an LPN with a corresponding map entry. In various embodiments, mapping is via one or more associative look-ups, via one or more non-associative look-ups, and/or via one or more other techniques.

In some embodiments, SSD Controller 100 maintains one map entry for each LPN potentially and/or actively in use.

In some embodiments, Map Info for LPN 221 includes respective Read Unit Address 223 and Length in Read Units 225. In some embodiments, a length and/or a span are stored encoded, such as by storing the length as an offset from the span, e.g. in all or any portions of Length in Read Units 225. In further embodiments, a first LPN is associated with a first map entry, a second LPN (different from the first LPN, but referring to a logical page of a same size as a logical page referred to by the first LPN) is associated with a second map entry, and the respective length in read units of the first map entry is different from the respective length in read units of the second map entry.

In various embodiments, at a same point in time, a first LPN is associated with a first map entry, a second LPN (different from the first LPN) is associated with a second map entry, and the respective read unit address of the first map entry is the same as the respective read unit address of the second map entry. In further embodiments, data associated with the first LPN and data associated with the second LPN are both stored in a same physical page of a same device in NVM 199.

According to various embodiments, Read Unit Address 223 is associated with one or more of: a starting address in the NVM; an ending address in the NVM; an offset of any of the preceding; and any other techniques for identifying a portion of the NVM associated with LPN 213.

Figure 3:
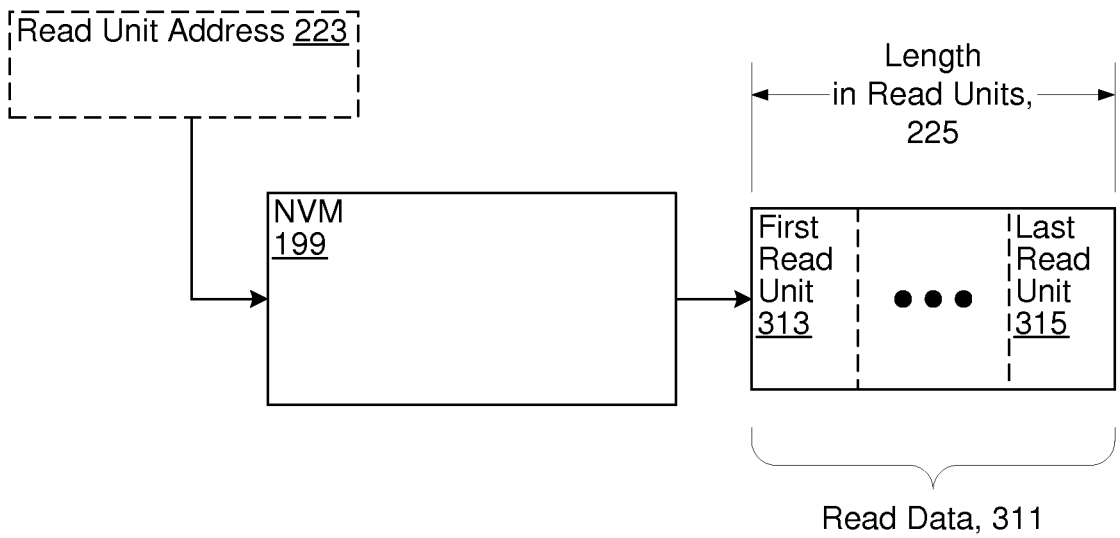
FIG. 3 illustrates selected details of an embodiment of accessing a Non-Volatile Memory (NVM) at a read unit address to produce read data organized as various read units, collectively having a length measured in quanta of read units.

FIG. 3 illustrates selected details of an embodiment of accessing an NVM at a read unit address to produce read data organized as various read units, collectively having a length measured in quanta of read units. According to various embodiments, First Read Unit 313 is one or more of: a one of read units in Read Data 311 with a lowest address in an address space of the NVM; a fixed one of the read units; an arbitrary one of the read units; a variable one of the read units; and a one of the read units selected by any other technique. In various embodiments, SSD Controller 100 is enabled to access NVM 199 and produce Read Data 311 by reading no more than a number of read units specified by Length in Read Units 225.

Figure 4A:
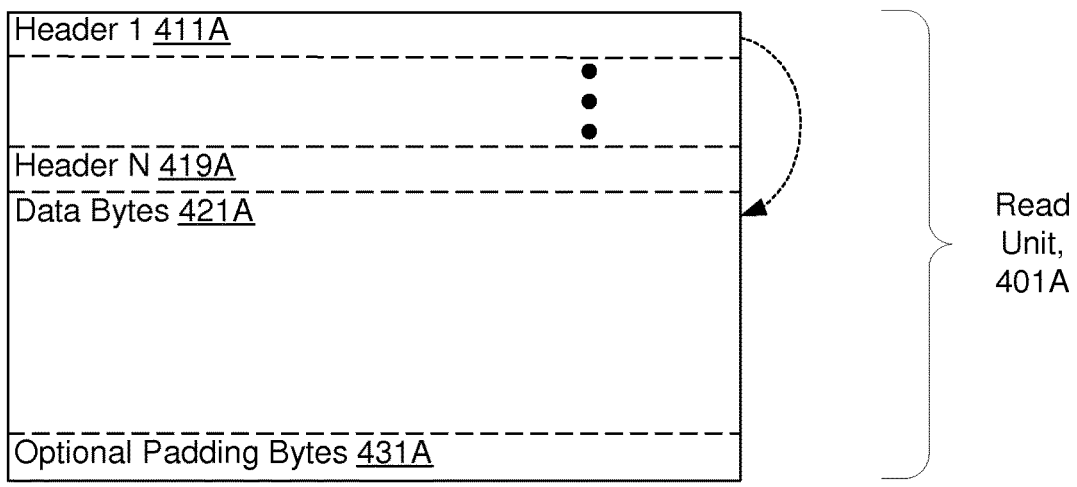
FIG. 4A illustrates selected details of an embodiment of a read unit.

FIG. 4A illustrates selected details of an embodiment of a read unit (such as Read Units 313 or 315 of FIG. 3) as Read Unit 401A. In various embodiments and/or usage scenarios, Header 1 411A through Header N 419A are contiguous, and respective data regions identified (such as via respective offsets) by each of the headers are contiguous following a last one of the headers. The data regions collectively form Data Bytes 421A. The data regions are stored in a location order that matches the location order the headers are stored. For example, consider a first header, at the beginning of a read unit, with a second header and a third header contiguously following the first header. A first data region (identified by a first offset in the first header) contiguously follows the third header. A second data region (identified by a second offset in the second header) contiguously follows the first data region. Similarly, a third data region (identified by the third header) contiguously follows the second data region.

Figure 4B:
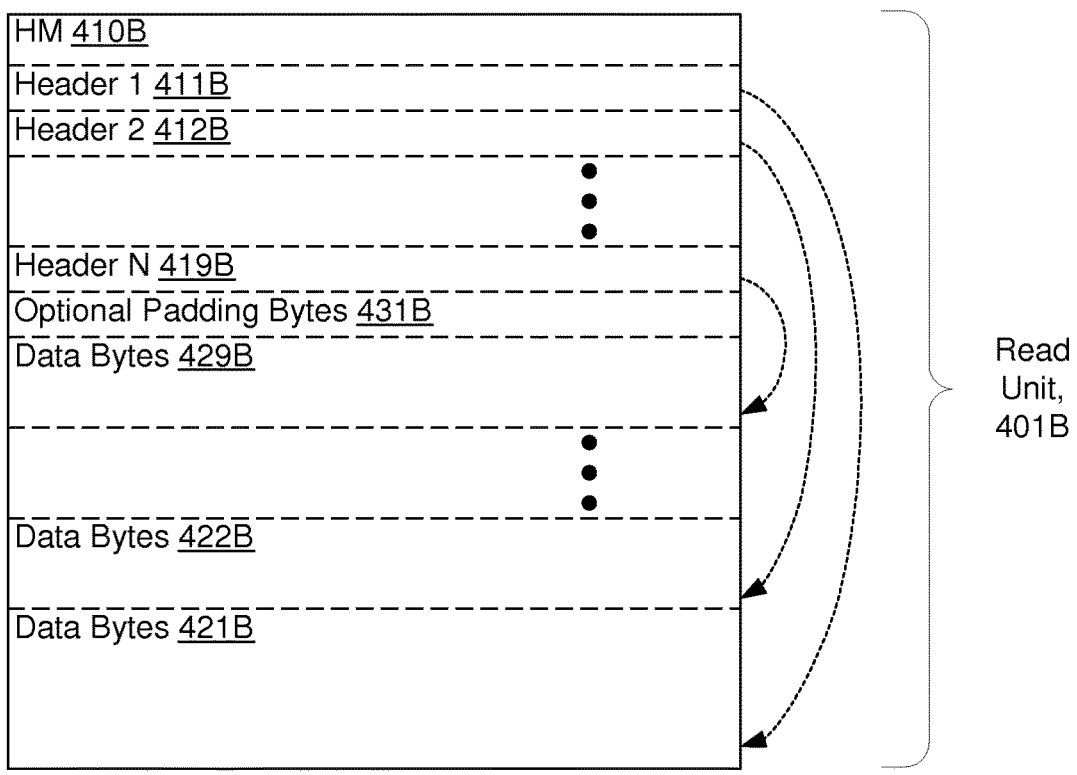
FIG. 4B illustrates selected details of another embodiment of a read unit.

FIG. 4B illustrates selected details of another embodiment of a read unit (such as Read Units 313 or 315 of FIG. 3) as Read Unit 401B. In various embodiments and/or usage scenarios, Header Marker (HM) 410B is an optional initial field (such as a one-byte field) indicating a number of following contiguous headers (Header 1 411B, Header 2 412B . . . Header N 419B). Data regions (Data Bytes 421B, Data Bytes 422B . . . Data Bytes 429B) are identified respectively by the headers (Header 1 411B, Header 2 412B . . . Header N 419B) and are stored in a location order that is opposite of the location order that the headers are stored. Headers start at the beginning of a read unit, while corresponding data regions start at the end of a read unit. In some embodiments, data bytes within a data region (e.g. Data Bytes 421B, Data Bytes 422B . . . Data Bytes 429B) are arranged in a forward order (byte order matching location order), while in other embodiments, the data bytes are arranged in a reverse order (byte order reversed with respect to location order). In some embodiments, a header marker is used in read units where headers and data bytes are stored in a same location order (e.g. as illustrated in FIG. 4A).

In some embodiments, Optional Padding Bytes 431A (or 431B) are according to granularity of data associated with a particular LPN. For example, in some embodiments, if Data Bytes 421A (or collectively Data Bytes 421B, Data Bytes 422B . . . Data Bytes 429B) have less than a fixed amount of remaining space, such as 8 bytes, after storing data associated with all but a last one of Header 1 411A through Header N 419A (or Header 1 411B, Header 2 412B . . . Header N 419B), then data for an LPN associated with the last header starts in a subsequent read unit. In further embodiments, a particular offset value (e.g. all ones) in the last header indicates that the data for the LPN associated with the last header starts in the subsequent read unit.

Figure 5:
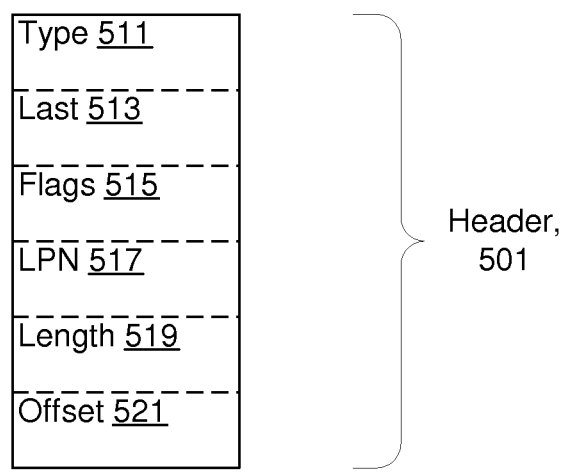
FIG. 5 illustrates selected details of an embodiment of a header having a number of fields.

FIG. 5 illustrates selected details of an embodiment of a header (such as any of Header 1 411A through Header N 419A of FIG. 4A or Header 1 411B through Header 419B of FIG. 4B) having a number of fields. In some embodiments, headers are fixed-length (e.g. each header is a same number of bytes long). Header 501 includes fields Type 511, Last Indicator 513, Flags 515, LPN 517, Length 519, and Offset 521. The type field identifies a category of the data bytes. For example, the type field indicates the category of the data bytes is one of host data (e.g. logical page data) or system data (e.g. map information or checkpoint information). The last field indicates that the header is the last header before the data bytes. In some embodiments with a header marker, the last field is optionally omitted. The LPN field is the LPN that the header is associated with. The LPN field enables parsing of the headers to determine a particular one of the headers that is associated with a particular LPN by, for example, searching the headers for one with an LPN field matching the particular LPN. The length field is the length, in bytes, of the data bytes (e.g. how many bytes of data there are in Data Bytes 421A associated with Header 501). In some embodiments, an offset in the offset field is rounded according to a particular granularity (e.g. 8-byte granularity).

In various embodiments, some or all information associated with a particular LPN is stored in a map entry associated with the particular LPN, a header associated with the particular LPN, or both. For example, in some embodiments, some or all of Length 519 is stored in a map entry rather than in a header.

Selected Aspects of Non-Volatile Memory Organization and Management

In various embodiments, NVM implementing mass storage of an SSD is implemented via one or more flash die. Each flash die includes an integer number of blocks (e.g. N blocks) and a block is a smallest quantum of erasing. In some embodiments, each block includes an integer number of pages and a page is a smallest quantum of writing. According to various embodiments, one or more of: a read unit is a smallest quantum of reading and error correction; each page includes an integer number of read units; an associated group of two or more pages includes an integer number of read units; and read units optionally and/or selectively span page boundaries.

In various embodiments, various NVM management functions (e.g. reading, recycling, erasing, and/or programming/writing) are performed in units sometimes referred to as R-blocks. An R-block is exemplified as a logical slice or section across all die of a flash memory. For example, in a flash memory having R flash die, each flash die having N blocks, each R-block is the $i^{th}$ block from each of the flash die taken together, for a total of N R-blocks. For another example, in a flash memory having R flash die, each with N blocks, each R-block is the $i^{th}$ and $(i+1)^{th}$ block from each of the flash die, for a total of N/2 R-blocks. For yet another example, in a flash memory having a plurality of dual plane devices, each R-block is the $i^{th}$ even block and the $i^{th}$ odd block from each of the dual plane devices.

Virtual Drive Manufacturing Model

Figure 6:
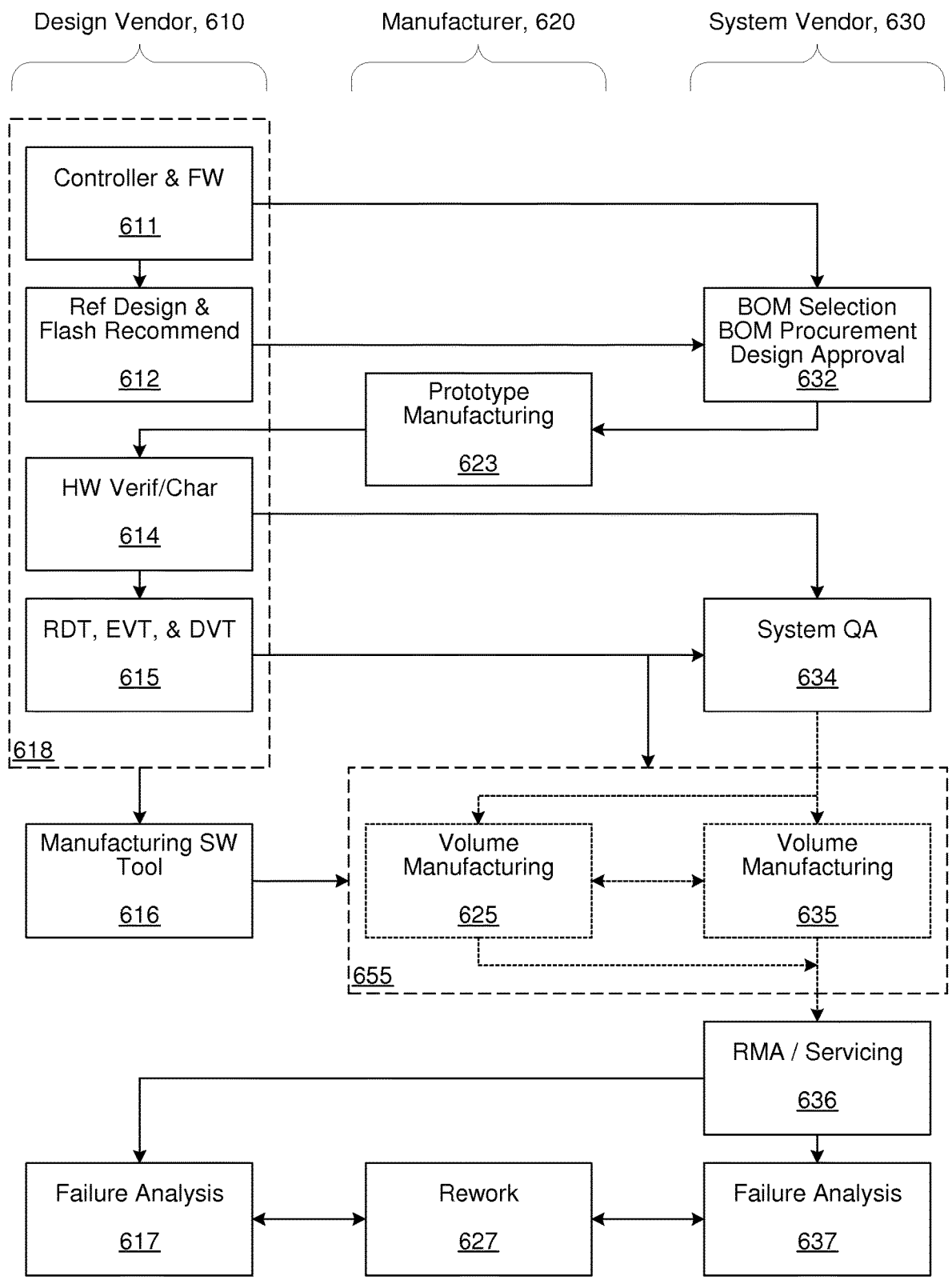
FIG. 6 illustrates a flow diagram of selected details of an embodiment of a virtual drive manufacturing model.

FIG. 6 illustrates a flow diagram of selected details of an embodiment of a virtual drive manufacturing model, such as a virtual SSD manufacturing model. Operations are illustrated as performed by three distinct business entities: Design Vendor 610 (e.g. an integrated circuit design company), Manufacturer 620 (e.g. a contract manufacturing company), and System Vendor 630 (e.g. an OEM). In various embodiments, the distinct business entities are distinct corporations, while in other embodiments, one or more of the distinct business entities are part of a same corporation. In various embodiments, any one or more of the distinct business entities are any one or more of: a corporation, a partnership, a proprietorship, one or more individuals operating either formally or informally as an ongoing enterprise, and one or more individuals operating without membership in any specific enterprise or organization. In various embodiments, any one or more of the distinct business entities are any one or more of: a for-profit entity, a non-profit entity, an educational entity, and a government entity.

Conceptually, the design vendor provides an SSD controller and associated firmware to the system vendor, along with a reference design and an associated list of recommended and/or supported flash memory devices (and/or other materials such as other devices/components) for producing an SSD using the SSD controller and one or more flash memory devices (and/or other materials) chosen from the list. The system vendor then selects materials to manufacture SSDs from, based at least in part on the SSD controller, the firmware, the reference design, the list, and/or one or more attributes thereof (e.g. price, availability, endurance, and/or performance). The selecting includes selecting one or more flash memory devices from among the list. The system vendor further procures the materials to manufacture one or more prototypes of the SSDs. In various embodiments, different ones of the prototypes are built using different ones of the selected flash memory devices, such as to enable comparison of the selected memory devices. A manufacturer (such as a contract manufacturer acting according to direction from the system vendor) builds the prototype SSDs. The design vendor evaluates the prototype SSDs and all or any portions of results of the evaluating are provided to the system vendor.

The system vendor, based at least upon a portion of the results provided, volume manufactures SSDs, directly or via a contract manufacturer (such as the contract manufacturer that built the prototype SSDs), or both. The system vendor procures (or directs procurement of) materials used in the volume manufacturing (e.g. SSD controllers from the design vendor and/or flash memory devices identified by the list and optionally from one or more flash memory vendors). The system vendor sells the volume manufactured SSDs to one or more customers (e.g. for use in an enterprise application such as a server, a cloud application such as a data center, an industrial application such as a ruggedized computer, and/or a client application such as a PC). Thus the system vendor is enabled to sell the volume manufactured SSD without paying a margin on flash memory devices (and/or other materials) built into the volume manufactured SSDs, other than a margin to vendors of the flash memory devices (and/or other materials) themselves.

In some embodiments and/or usage scenarios, the system vendor performs RMA and/or servicing operations, at least with respect to interactions with the customers, optionally based in whole or in part on training and/or tools provided to the system vendor by the design vendor. The RMA and/or servicing provide information to failure analysis operations performed by the system vendor, the design vendor, or both, according to various embodiments. Rework of all or any portions of the volume manufactured SSDs is performed, for example, by the contract manufacturer.

Example system vendors include so-called "cloud providers" (e.g. Google, Facebook, and Amazon), data center implementers/users (e.g. banks, pharmaceutical companies, and financial services companies), and OEMs of systems including SSDs. Other example system vendors include some types of manufacturers, such as some contract manufacturers and/or some original design manufacturers.

More specifically, and as illustrated by the figure, the design vendor implements an SSD controller and firmware for execution by the SSD controller (Controller & FirmWare 611). The design vendor produces at least one associated reference design and a list of recommended and/or supported flash memory devices for use with each of the reference designs (Reference Design & Flash Recommendation 612), based at least in part on the SSD controller and the firmware. The design vendor produces documentation and engineering/debug samples of one or more SSDs, using, e.g., the SSD controller, the firmware, the at least one reference design, and one or more of the flash memory devices of the list. The documentation (e.g. marketing collateral and/or engineering information) is based in whole or in part on any one or more of evaluation/characterization (e.g. price, performance, and/or features) of the sample SSDs and the flash memory devices of the list, as well as design documents otherwise internal to the design vendor (e.g. architectural documents describing the SSD controller, the firmware, and/or the at least one reference design).

The design vendor provides all or any portions of the documentation, one or more of the sample SSDs, the at least one reference design, and/or the list (of recommended and/or supported flash memory devices) to the system vendor. Based at least in part on the aforementioned items provided by the design vendor to the system vendor, the system vendor selects and procures materials necessary for volume manufacturing of an SSD (or alternatively initially quantities of the materials sufficient for prototype construction) and approves a design for the volume-manufactured SSD (BOM Selection, BOM Procurement, and Design Approval 632). The selection includes selecting one or more flash memory devices from among the flash memory devices of the list. The procurement includes procuring sufficient quantities of the selected flash memory devices for prototype construction and/or volume production of SSDs. The volume-manufactured SSD is in accordance with the at least one reference design and uses the SSD controller, the firmware (or optionally and/or selectively one or more versions of the firmware customized for the system vendor, such as an enterprise version, a cloud version, an industrial version, and/or a client version), and the selected flash memory devices. In some embodiments, the firmware (or the customized versions of the firmware) is licensed to the system vendor for use in SSDs manufactured with the SSD controller.

Subsequently the System Vendor 630 directs Manufacturer 620 to construct one or more prototype SSDs (Prototype Manufacturing 623) in accordance with the at least one reference design, and including the SSD controller, the firmware, and the selected flash memory devices of the list. The prototype SSDs are constructed using at least some materials (e.g. the SSD controller and the selected flash memory devices) procured by the system vendor. In some embodiments and/or usage scenarios (not illustrated), the system vendor constructs the prototype SSDs.

Design Vendor 610 then evaluates and/or characterizes the prototype SSDs, such as via hardware verification and characterization (HardWare Verification/Characterization 614) and/or reliability and verification tests (RDT, EVT, & DVT 615). The hardware verification and characterization optionally includes interoperability and/or compliance checking. For example, the prototype SSDs are verified for compliance to a host interface protocol and/or an electrical signaling standard. According to various embodiments, the design vendor performs the evaluating and/or characterizing using the firmware, one or more versions of the firmware customized for the system vendor, or any combination thereof. The design vendor provides one or more results of the verification/characterization to the system vendor. The system vendor examines at least some of the provided results and determines that the prototype SSDs are of sufficient quality for volume manufacturing (System Quality Assurance 634). The design vendor provides one or more results of the reliability and verification tests to volume manufacturing (Volume Manufacturing 655), such as performed by the manufacturer (Volume Manufacturing 625) and/or the system vendor (Volume Manufacturing 635). The system vendor provides results of the system quality assurance to the volume manufacturing (whether performed by the manufacturer, the system vendor, or both).

In some embodiments, to enable volume manufacturing of the volume-manufactured SSDs, Design Vendor 610 provides a manufacturing software tool (Manufacturing SoftWare Tool 616) for optional use in volume manufacturing (such as Volume Manufacturing 655, whether performed by Manufacturer 620 as Volume Manufacturing 625 or System Vendor 630 as Volume Manufacturing 635). In various embodiments and/or usage scenarios, the manufacturing software tool is based on information from any one or more of: Controller & FirmWare 611, Reference Design & Flash Recommendation 612, HardWare Verification/Characterization 614, and RDT, EVT, & DVT 615, illustrated collectively as Selected Design Vendor Operations 618. For example, in some embodiments, the manufacturing software tool is a program running on a computer system coupled to a plurality of the volume-manufactured SSDs, and enabled to communicate with, such as to configure, all of the plurality of the volume-manufactured SSDs substantially, wholly, or partially in parallel.

According to various embodiments and/or usage scenarios, the manufacturing software tool enables and/or performs one or more of: initially configuring one of the volume-manufactured SSDs; downloading the firmware onto the one of the volume-manufactured SSDs; performing MST or other diagnostic functions on the one of the volume-manufactured SSDs; performing assignment of a respective unique encryption key for the one of the volume-manufactured SSDs; assigning other unique IDs to the one of the volume-manufactured SSDs (such as an Ethernet MAC address); recording information in a database (such as a manufacturing record and/or manufacturing statistics); communicating (such as via the Internet), with servers of the design vendor as part of the assignment of the unique encryption key and/or for key escrow; and other functions optionally and/or selectively used as part of the volume manufacturing. In some embodiments, the manufacturing software tool is used for prototype construction (such as for Prototype Manufacturing 623). See "Manufacturing Software Tool" elsewhere herein for further description.

The system vendor then sells one or more of the volume-manufactured SSDs. Some of the volume-manufactured SSDs that are sold are returned by customers, such as due to perceived defects, failures, faults, imperfections, and/or deficiencies. The system vendor receives returned ones of the sold SSDs from the customers, and performs incoming inspection and/or servicing (RMA/Servicing 636). Dependent, for example, on results of the inspection and/or servicing, the returned SSDs are provided for failure analysis, such as performed by the design vendor (Failure Analysis 617) and/or the system vendor (Failure Analysis 637). In some circumstances, the manufacturer (and/or the system vendor, not specifically illustrated) attempts to repair, revise, and/or fix some of the SSDs that have been failure analyzed (Rework 627). The system vendor then optionally sells successfully reworked ones of the failure analyzed SSDs (not illustrated). In some embodiments, the design vendor supplies the system vendor with one or more software tools to aid the failure analysis and/or determination of where (e.g. the design vendor, the manufacturer, or the system vendor) the returned SSDs are to be sent after the failure analysis.

In various embodiments and/or usage scenarios, the design vendor sells instances of the SSD controller to the system vendor, licenses use of the firmware to the system vendor, produces and licenses use of firmware that is a customized by the design vendor for the system vendor, or any combination thereof.

In some licensing-based embodiments, SSD production (e.g. prototype or volume) is enabled at least in part via the design vendor licensing to the system vendor various capabilities, such as firmware licensing, firmware stamping, and/or firmware extraction. In some of the licensing-based embodiments, use of a manufacturing software tool (such as Manufacturing SoftWare Tool 616) is required by terms of the licensing by the design vendor to the system vendor. In some of the licensing-based embodiments requiring use of a manufacturing software tool, performance of one or more of firmware licensing, firmware stamping, and/or firmware extraction are required (e.g. via terms of the licensing by the design vendor to the system vendor) to be via the manufacturing software tool. According to various embodiments, requiring use of Manufacturing SoftWare Tool 616 as provided by Design Vendor 610 enables Design Vendor 610 to one or more of: monitor production and/or track firmware or other licenses for SSDs, such as by Manufacturing SoftWare Tool 616 reporting statistics and/or other information to Design Vendor 610 via the internet; perform functions such as key escrow for manufactured SSDs; and other monitoring, tracking, licensing, or escrow functions.

Although not specifically illustrated in the figure, in some embodiments and/or usage scenarios, some of the illustrated operations provide feedback to others of the illustrated operations. For example, some or all of the results of HardWare Verification/Characterization 614 and/or RDT, EVT, & DVT 615 are fed back to Controller & FirmWare 611 and/or Reference Design & Flash Recommendation 612. For another example, information obtained from Volume Manufacturing 625 and/or Volume Manufacturing 635 is fed back to any one or more of Controller & FirmWare 611, Reference Design & Flash Recommendation 612, and BOM Selection, BOM Procurement, and Design Approval 632. For yet another example, data gathered from any one or more of RMA/Servicing 636, Failure Analysis 617, Failure Analysis 637, and/or Rework 627 is fed back to any one or more of Controller & FirmWare 611, Reference Design & Flash Recommendation 612, BOM Selection, BOM Procurement, and Design Approval 632, Volume Manufacturing 625, and Volume Manufacturing 635.

In some embodiments and/or usage scenarios, operations illustrated in FIG. 6 are conceptually replicated by a same design vendor with a plurality of system vendors (and optionally a corresponding plurality of manufacturers). Thus the design vendor provides virtual drive manufacturing capability to the plurality of system vendors.

In various embodiments and/or usage scenarios, the SSD controller and/or the firmware implemented by the design vendor (Controller & FirmWare 611) are enabled to operate with flash memory devices from a plurality of flash memory device vendors. For example, the SSD controller and/or the firmware are enabled to operate with flash memory devices having varying read, write (program), and/or erase techniques, parameters, and/or characteristics. Continuing with the example, the SSD controller includes memory (e.g. Scaled Data Structures 126 of Control RAM 125) used (e.g. by the firmware and/or various hardware state machines) to track numbers of operations (e.g. reads, writes, and/or erases) or characteristics of the operations (number of retries, soft errors, and/or hard errors) on each flash die, block thereof, page thereof, or any portions or sub-portion thereof. The SSD controller selectively and/or optionally varies read, write, and/or erase operations in accordance with the tracked number of operations, the tracked characteristics of the operations, and/or specific characteristics of particular flash memory devices the SSD controller is managing. In some circumstances, the variation in operation of the read, write, and/or erase operations by the SSD controller enables operation of the SSD controller with various flash memory devices from a plurality of flash memory vendors, and the various flash memory devices are included in the list of recommended and/or supported flash memory devices.

For another example, the SSD controller and/or the firmware are enabled to manage flash memory devices in accordance with various error recovery codes, such as one or more of zero or more parity codes, zero or more RS codes, zero or more BCH codes, zero or more Viterbi or other trellis codes, and zero or more LDPC codes. Continuing with the example, the SSD controller and/or the firmware are enabled to manage selected flash memory devices from a first flash memory vendor in accordance with a variety of BCH codes of a first code rate, as well as selected flash memory devices from a second flash memory vendor in accordance with a variety of BCH codes of a second code rate. Further, the SSD controller and/or the firmware are enabled to manage flash memory devices of a first category from a third flash memory vendor in accordance with a variety of parity codes, and flash memory devices of a second category from the third flash memory vendor in accordance with a variety of LDPC codes. The list of recommended and/or supported flash memory devices optionally includes one or more of the selected flash memory devices from the first flash memory vendor, the selected flash memory devices from the second flash memory vendor, and the flash memory devices of the first and the second categories from the third flash memory vendor.

In various embodiments and/or usage scenarios, the SSD controller and/or the firmware are enabled to operate with host LBs of various sized quanta, such as any one or more of 512, 516, 520, 524, 528, 532, 536, 540, 1024, 1032, 2048, 2056, 4096, 4100, 4104, 4108, 4112, 4116, 4160, 4164, 4172, 4192, 4196, 4204, 4224, 4228, 4236, and 4256 bytes. Operation with any of the aforementioned LB sizes enables using the SSD controller and/or the firmware in a variety of SSD products targeting a respective variety of prospective customers. For example, the system vendor offers one or more SSD products enabled to operate with any two or more of the aforementioned LB sizes to an enterprise customer that is a server (e.g. storage server) vendor, or to a cloud customer that is a data center vendor, and offers one or more SSD products enabled to operate with 512-byte LBs to an industrial customer that is a ruggedized computer vendor, or to a client customer that is a PC (e.g. laptop) vendor.

In various embodiments and/or usage scenarios, the SSD controller and/or the firmware are enabled to implement SSDs of varying capacities, enabling SSD products targeting a respective variety of prospective customers. For example, the system vendor offers a relatively large capacity SSD to an enterprise customer that is a server (e.g. storage server) vendor or to a cloud customer that is a data center vendor, and offers a relatively small capacity SSD to an industrial customer that is a ruggedized computer vendor or to a client customer that is a PC (e.g. laptop) vendor. For another example, the system vendor offers two SSDs to an enterprise and/or a cloud customer, a first one of the SSDs having a relatively larger capacity and capable of relatively slower random accesses, and a second one of the SSDs having a relatively smaller capacity and capable of relatively faster random accesses. In some embodiments, the SSD controller and/or the firmware are enabled to implement SSDs of varying capacities at least in part via a two-level mapping of host LBAs to NVM locations. The two-level mapping is implemented, e.g., in part via a division of an LBA by a programmable value representing a number of SLM entries per SLM page, resulting in a quotient and a remainder. The quotient selects an FLM entry and the remainder selects a particular entry of an SLM page selected by the selected FLM entry (see "LBA to NVM Location Mapping" elsewhere herein for further description).

In various embodiments and/or usage scenarios, the SSD controller and/or the firmware are enabled to implement SSDs of varying temperature capabilities, such as reliable operation over a non-extended temperature range and operation over an extended temperature range, enabling SSD products targeting various temperature ranges. For example, a system vendor offers non-extended temperature range SSDs to an enterprise, cloud, and/or client customer, and extended temperature range SSDs to an industrial customer. In some embodiments, the SSD controller and/or the firmware are enabled to implement SSDs of varying temperature capabilities at least in part via compatible operation with non-volatile memory devices of varying temperature capabilities.

In various embodiments and/or usage scenarios, the SSD controller and/or the firmware are enabled to implement SSDs of varying reliability, endurance, and/or predictability of performance, enabling SSD products targeting various reliability, endurance, and/or predictability of performance feature sets. For example, a system vendor offers relatively higher reliability and endurance SSDs to an enterprise, cloud, and/or industrial customer, and relatively lower reliability and endurance SSDs to a client customer. For another example, a system vendor offers SSDs having performance that is relatively more predictable to a cloud customer, and offers SSDs having performance that is relatively less predictable to an enterprise, industrial and/or client customer. In some embodiments, the SSD controller and/or the firmware are enabled to implement SSDs of varying reliability and/or endurance at least in part via operation with non-volatile memory devices of varying reliability and/or endurance. In some embodiments, the SSD controller and/or the firmware are enabled to implement SSDs of varying reliability and/or endurance at least in part via operating same non-volatile memory devices in modes of varying reliability and/or endurance (e.g. operating MLC devices in either an SLC mode or an MLC mode). In some embodiments, the SSD controller and/or the firmware are enabled to implement SSDs of varying predictability in performance at least in part via varying an amount of overprovisioning (e.g. in some usage scenarios higher overprovisioning enables higher predictability of performance).

Thus using the division and varying the programmable value enables, for a fixed size of storage allocated to storage of a two-level map (such as storage of a first level of the two-level map and/or storage of a cache of second-level map pages), a relatively larger capacity SSD being mapped with a relatively larger granularity than a relatively smaller capacity SSD. As granularity of mapping decreases, in some embodiments and/or usage scenarios, a number of simultaneously active map entries available increases. In some circumstances, as the number of simultaneously active map entries increases, performance of random accesses and/or a number of independent sequential streams that are efficiently processed increases.

In various embodiments and/or usage scenarios, the SSD controller implemented by the design vendor (Controller & FirmWare 611) is identical to or a variation of SSD Controller 100 of FIG. 1A. In various embodiments and/or usage scenarios, the firmware implemented by the design vendor (Controller & FirmWare 611) is identical to or a variation of Firmware 106 of FIG. 1B. In various embodiments and/or usage scenarios, the at least one reference design produced by the design vendor (Reference Design & Flash Recommendation 612) is identical to or a variation of SSD 101 of FIG. 1A, e.g. as used in any of the embodiments and/or contexts illustrated in FIG. 1B. In various embodiments and/or usage scenarios, the list of recommended and/or supported flash memory devices produced by the design vendor (Reference Design & Flash Recommendation 612) is with respect to any one or more of Flash Device 192, Flash Die 194, and NVM 199, as illustrated in FIG. 1A.

The foregoing description of FIG. 6 focuses on flash memory devices as elements that are specifically recommended and/or supported by the design vendor with respect to the BOM selection performed by the system vendor. In various other embodiments, various other (or additional) materials such as other devices/components including power supplies, temperature sensors, casings, printed circuit boards, and passive components are specifically recommended and/or supported by the design vendor with respect to the BOM selection performed by the system vendor. For example, first and second temperature sensors from a first temperature sensor vendor are recommended and/or supported by the design vendor, while a third temperature sensor from a second temperature sensor vendor is not recommended and is not supported by the design vendor (e.g. due to lack of support in firmware). Thus the system vendor is free to choose from among the first and second temperature sensors, but not the third temperature sensor, when selecting materials for prototyping or manufacturing of an SSD.

SSD Volume Manufacturing and Prototype Construction

Figure 7A:
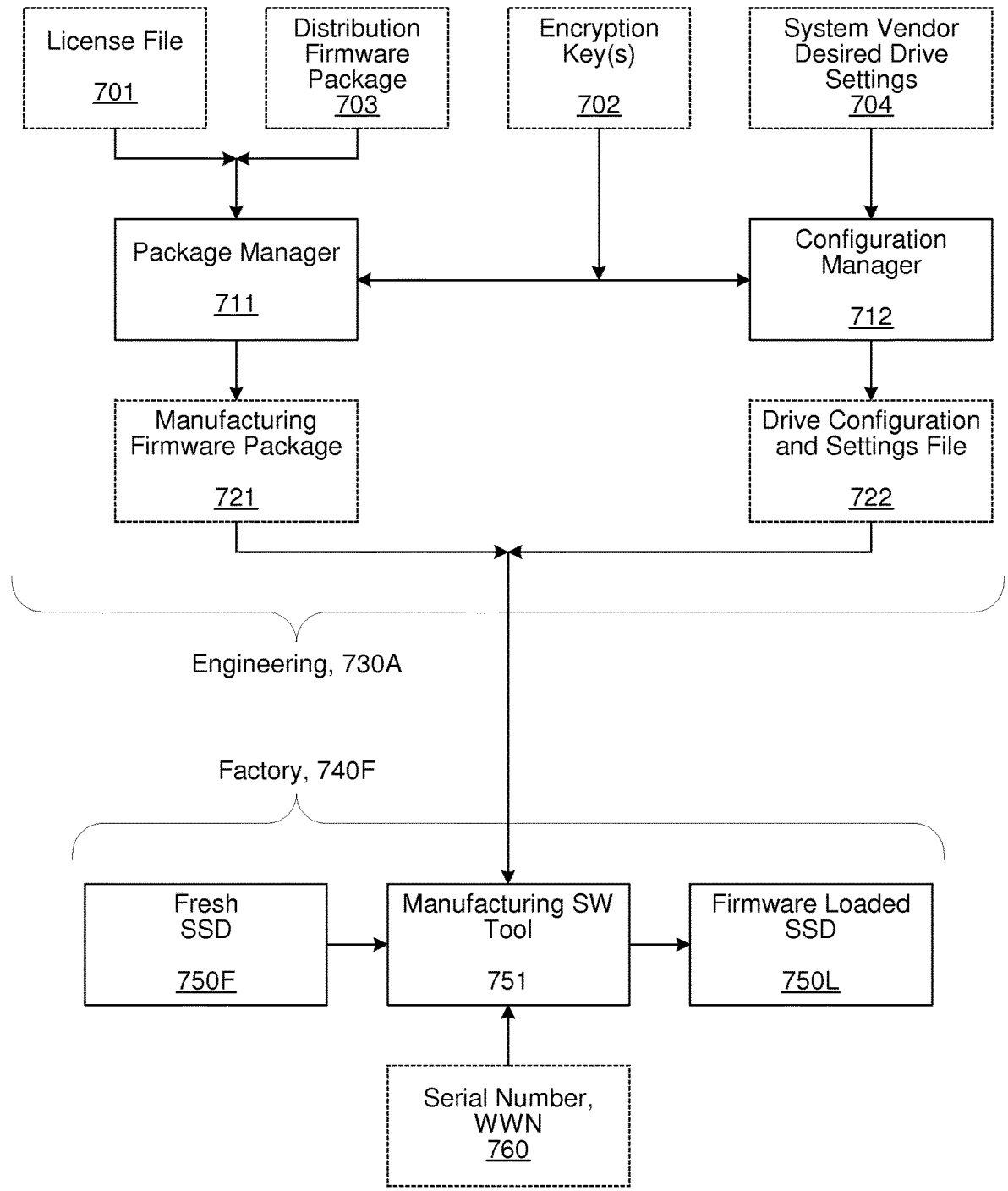
FIG. 7A illustrates a conceptual representation of selected details of an embodiment of (volume) manufacturing (or prototype constructing) of SSDs in accordance with a virtual drive manufacturing model.

FIG. 7A illustrates a conceptual representation of selected details of an embodiment of (volume) manufacturing (or prototype constructing) of SSDs in accordance with a virtual drive manufacturing model. The illustrated elements are grouped into two decoupled portions, optionally enabling engineering setup operations to be performed separately from factory operation. The first portion (Engineering 730A) is performed, e.g., once per single production run or once for a series of production runs of a same model SSD, to setup for the production runs. The second portion (Factory 740F) is performed for each production run, whether a single production run (such as for prototype construction) or one of a series of production runs of a same model SSD (such as for volume manufacturing), to finalize a variety of aspects of manufacturing of each respective SSD. According to various embodiments and/or usage scenarios, all or any portions of operations depicted as elements of Engineering 730A are performed by one or more of: System Vendor 630 of FIG. 6, and Manufacturer 620 of FIG. 6.

The elements of Engineering 730A include production of a firmware image, sometimes referred to as "stamped firmware" (Manufacturing Firmware Package 721), for manufacture of one or more SSDs. The manufacturing firmware image is produced according to a license description (License File 701) and a distributed firmware image (Distribution Firmware Package 703) via an application program (Package Manager 711). The package manager extracts firmware from the distribution firmware package using the license file, and performs one or more stamping functions (such as to encrypt, secure, personalize, and/or customize the manufacturing firmware package), producing the manufacturing firmware package. The package manager optionally produces drive configuration templates for all or any of available licensed drive configurations (e.g., configurations that a design vendor has agreed to provide and/or support with respect to the system vendor) as identified in the license file. In some embodiments, the package manager is enabled to interact via a GUI. In various embodiments and/or usage scenarios, any one or more of the license file, the distribution firmware package, and the package manager are provided by Design Vendor 610 of FIG. 6.

The elements of Engineering 730A further include production of one or more command line inputs and/or files (Drive Configuration and Settings File 722) for controlling manufacturing software used by elements of Factory 740F. The drive configuration and settings file is produced according to a description of drive configuration and/or parameters (System Vendor Desired Drive Settings 704) via an application program (Configuration Manager 712). The configuration manager is optionally operable as a central repository for managing all SSD settings and/or download options. In some embodiments, the configuration manager is enabled to operate as a GUI with a control panel for drive settings and firmware download flow options. In some embodiments and/or usage scenarios, the system vendor desired drive settings are provided by System Vendor 630 of FIG. 6, and the configuration manager is provided by Design Vendor 610 of FIG. 6.

The manufacturing firmware package and the drive configuration and settings file are passed from Engineering 730A to Factory 740F, for use by Manufacturing SoftWare Tool (MT) 751. The manufacturing tool is enabled to download firmware into an SSD having no firmware, or alternatively an SSD having firmware to be replaced/upgraded (Fresh SSD 750F). The fresh SSD is thereby transformed into an SSD with newly downloaded firmware (Firmware Loaded SSD 750L). The downloaded firmware is based on the manufacturing firmware package, the drive configuration and settings file, and unique identification information (Serial Number, World Wide Name (WWN) 760, a diagnostic unlock key, and/or vendor identity data).

In some embodiments and/or usage scenarios, downloading firmware includes productizing the SSD, via, for example, setting a unique serial number and/or a unique WWN. In some embodiments and/or usage scenarios, the Manufacturing SoftWare Tool is enabled to provide and/or to escrow an encryption key, such as a public encryption key, that is unique to the SSD. In further embodiments and/or usage scenarios, the providing and/or the escrowing includes communicating with servers operated by the design vendor. In some embodiments and/or usage scenarios, the Manufacturing SoftWare Tool is enabled to reset SMART attributes and/or logs (e.g. perform a ClearSMART) to a clean factory shipping state after performing of one or more factory tests.

In some embodiments, downloading firmware includes performing a secure erase of the SSD, for example, as a final operation before release of the SSD to a customer. In some embodiments, the manufacturing tool is enabled to direct downloaded firmware to perform one or more manufacturing tests on the SSD the firmware is downloaded into. The manufacturing tests include an MST of the SSD and/or a test of flash memory of the SSD.

An example of "an SSD having no firmware" is a collection of elements that after having firmware downloaded (and optionally after performing one or more subsequent manufacturing operations) is operable as an SSD. For instance, SSD 101 of FIG. 1B, with FW 106 not yet downloaded, is an example of an SSD having no firmware.

As a specific example of manufacturing a particular SSD, a system vendor develops a particular manufacturing firmware package from a license file provided by a design vendor and a distribution firmware package provided by the design vendor. The system vendor develops the particular manufacturing firmware package using a package manager application from the design vendor and executed, e.g., on a PC running a version of Linux. The system vendor determines desired drive settings (e.g. capacity, over provisioning, reliability features, and other product- and/or model-specific attributes) for the particular SSD and supplies the desired drive settings to a configuration manager application from the design vendor and executed, e.g., on the PC. The configuration manager application produces a particular file of one or more particular command lines, the particular command lines being specific to the particular SSD and the desired drive settings.

Continuing with the example, a manufacturer transforms an SSD having no firmware into with an SSD with firmware using a manufacturing tool provided by the design vendor. The manufacturing tool downloads the manufacturing firmware package, controlled via the particular command lines, into the SSD having no firmware, thereby transforming the SSD having no firmware into an SSD having firmware. The manufacturing tool optionally directs the SSD having firmware to perform an MST via the downloaded firmware. The particular command lines, e.g., specify generation of serial number and/or WWN information that is used to customize each instance of firmware that is downloaded, such that, for instance, every manufactured SSD has a unique WWN and/or a unique serial number.

In various embodiments, any one or more of Package Manager 711, Configuration Manager 712, and Manufacturing SoftWare Tool (MT) 751 are all or any portions of Manufacturing SoftWare Tool 616 of FIG. 6, or variation(s) thereof.

Figure 7B:
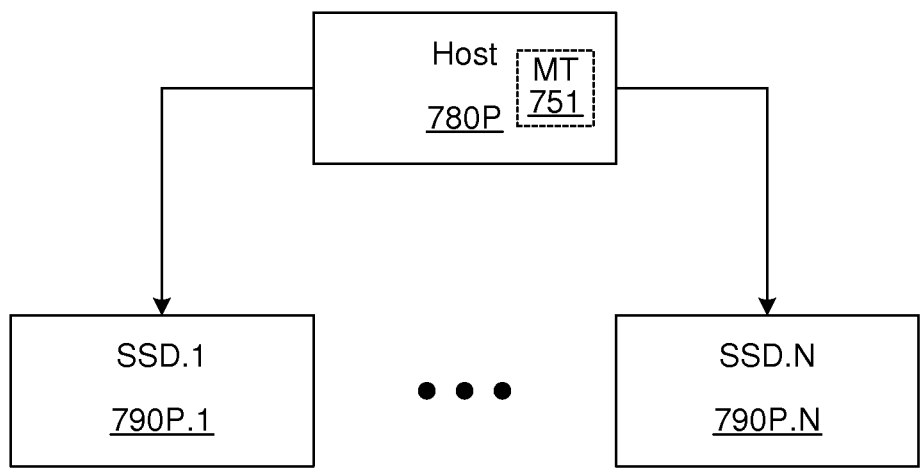
FIG. 7B illustrates selected details of an embodiment of a system for (volume) manufacturing (or prototype constructing) of SSDs in accordance with a virtual drive manufacturing model.

FIG. 7B illustrates selected details of an embodiment of a system for (volume) manufacturing (or prototype constructing) of SSDs in accordance with a virtual drive manufacturing model. A computing host, such as a workstation computer, a PC, a laptop computer, or a notebook computer (Host 780P) is coupled to one or more SSDs (illustrated as SSD.1 790P.1 . . . SSD.N 790P.N). The computing host is enabled to execute manufacturing tool application software (e.g. Manufacturing SoftWare Tool (MT) 751 as illustrated in Host 780P and as further illustrated in another context in FIG. 7A). Embodiments are contemplated having any number of SSDs coupled to a single host, as well as embodiments with a plurality of hosts, each of the hosts coupled to a respective group of one or more SSDs. In embodiments having a plurality of SSDs coupled to a single host, the single host is optionally enabled, via the manufacturing software tool, to direct firmware downloading to and/or a manufacturing test(s) on any number of the coupled SSDs wholly or partially in parallel.

In operation, Host 780P executes Manufacturing SoftWare Tool (MT) 751 to download firmware into any one or more of SSD.1 790P.1 . . . SSD.N 790P.N, thus transforming one or more SSDs without firmware into one or more SSDs with firmware (as illustrated by Fresh SSD 750F, Manufacturing SoftWare Tool (MT) 751, and Firmware Loaded SSD 750L of FIG. 7A).

In some embodiments, the manufacturing software tool is operable via a command line invocation, such as a series of one or more command lines interpreted by a shell program executing on a host (e.g. Host 780P). As a specific example, the command line invocation includes a first parameter identifying the manufacturing software tool (e.g. Manufacturing SoftWare Tool (MT) 751), a second parameter identifying a particular device corresponding to an SSD that is ready to accept firmware (e.g. one of SSD.1 790P.1 . . . SSD.N 790P.N), a third parameter identifying a drive configuration file (e.g. Drive Configuration and Settings File 722 of FIG. 7A), fourth and fifth parameters that are respectively a serial number and a WWN (e.g. Serial Number, World Wide Name (WWN) 760 of FIG. 7A) for the SSD that is ready to accept firmware. A sixth (optional) parameter specifies a diagnostic unlock key. In some embodiments and/or usage scenarios, the diagnostic unlock key is used to prevent unauthorized access to particular commands during use of an SSD produced via the manufacturing software tool, e.g. diagnostic commands that are unique to a particular system vendor. A seventh (optional) parameter specifies a 512 B vendor identity data file, e.g. a collection of information unique to the particular system vendor. An eighth (optional) parameter specifies a name of an output and/or log file. In further embodiments, the output and/or log is written with status information including results of the downloading and/or of any MST and/or flash device test performed on the SSD.

Figure 7C:
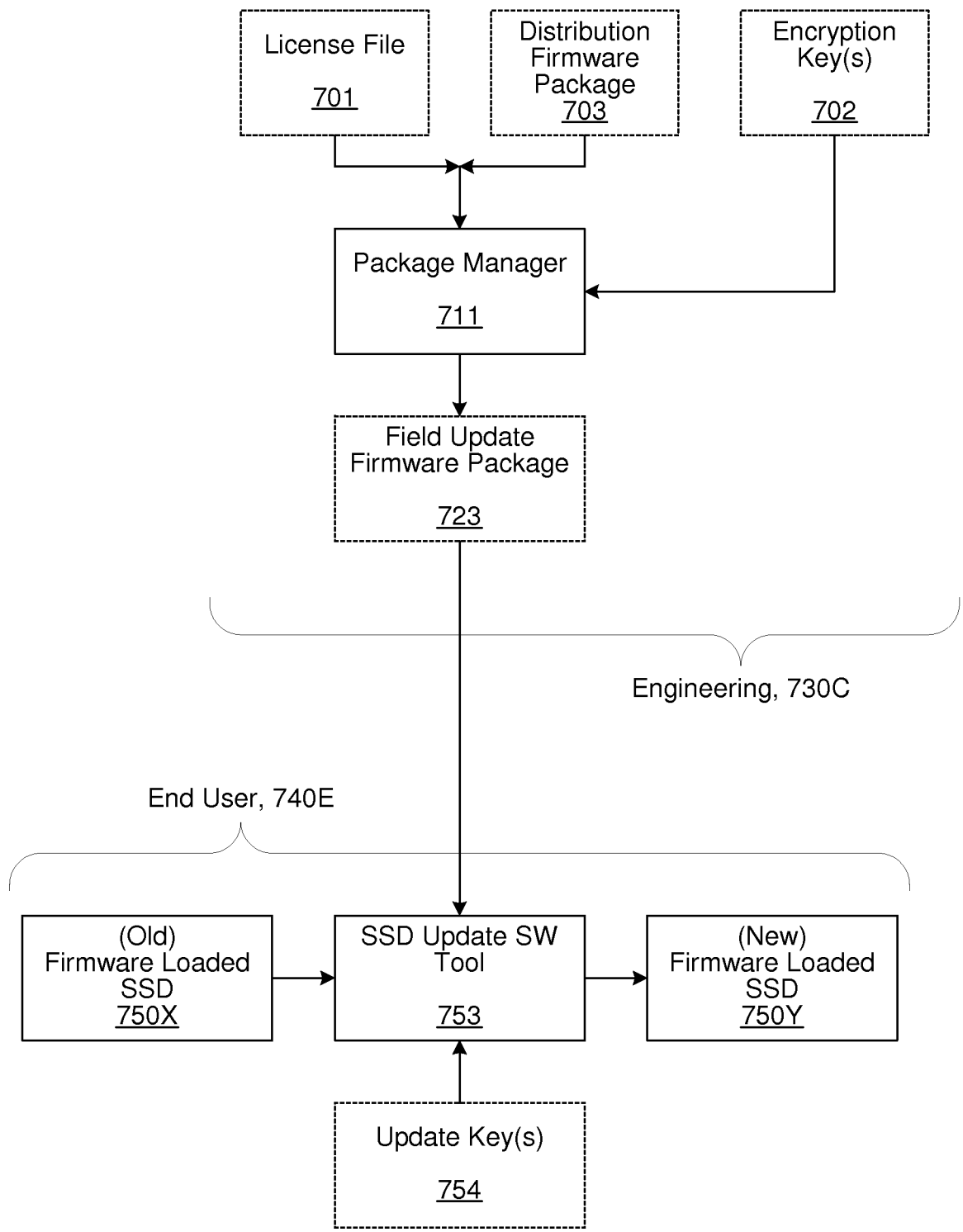
FIG. 7C illustrates a conceptual representation of selected details of an embodiment of firmware updating of SSDs in accordance with a virtual drive manufacturing model.

FIG. 7C illustrates a conceptual representation of selected details of an embodiment of firmware updating of SSDs in accordance with a virtual drive manufacturing model, such as SSDs produced via embodiments such as illustrated by FIG. 7A and/or FIG. 7B. As in FIG. 7A, the illustrated elements are grouped into two decoupled portions, optionally enabling engineering setup operations to be performed separately from firmware updating. The first portion (Engineering 730C) is performed, e.g., once per firmware release per single production run or once per firmware release per a series of production runs of a same model SSD, to setup for the firmware updating. The second portion (End User 740E) is performed for each firmware update, whether for a single production run (such as for prototype firmware updating) or one of a series of production runs of a same model SSD (such as for end user firmware updating). According to various embodiments and/or usage scenarios, all or any portions of operations depicted as elements of Engineering 730C are performed by one or more of System Vendor 630 of FIG. 6 and Manufacturer 620 of FIG. 6. In some embodiments and/or usage scenarios, elements of Engineering 730C are performed by a same organization as elements of Engineering 730A of FIG. 7A.

The elements of Engineering 730C include production of a field update firmware image (Field Update Firmware Package 723), for firmware updating of one or more SSDs. Similar to Manufacturing Firmware Package 721 of FIG. 7A, the field update firmware image is produced according to License File 701 and Distribution Firmware Package 703 via Package Manager 711. The package manager extracts firmware usable for firmware updating from the distribution firmware package using the license file, and performs one or more stamping functions (such as to encrypt, secure, personalize, and/or customize the field update firmware package), producing the field update firmware package. For example, the package manager personalizes a particular field update firmware package to match all or any portions of personalization performed by the package manager when producing a corresponding particular manufacturing firmware package used to produce SSDs that are to have firmware updated via the particular field update firmware package. For another example, the package manager adds a hashed stamp (e.g. as part of an element at the beginning of the field update firmware package, or as part of an element at the end of the field update firmware package) to the field update firmware package, personalizing the field update firmware package. The stamp includes one or more security measures to enable the field update firmware package to be usable only on SSDs having firmware with a hashed stamp that matches the stamp of the field update firmware package.

The field update firmware package is passed from Engineering 730C to End User 740E, for use by SSD Update SoftWare Tool (UT) 753. The SSD update tool is enabled to update firmware via a firmware download into an SSD having (old) firmware ((Old) Firmware Loaded SSD 750X). The SSD with the old firmware is thereby transformed into an SSD with new firmware ((New) Firmware Loaded SSD 750Y). In some embodiments and/or usage scenarios, the firmware update is unlocked and/or enabled via one or more keys, vendor identifiers, firmware override strings, and/or various security techniques (represented by Encryption Key (s) 754). The unlocking and/or enabling are compatible with the stamping functions performed by the package manager when producing the field update firmware package. Thus unauthorized parties are prevented from performing a firmware upgrade, e.g., downloading new/revised firmware onto an SSD previously having downloaded firmware. In various contexts, End User 740E is representative of any one or more of a design vendor (e.g. desiring an engineering change to firmware), a system vendor and/or a manufacturer (e.g. desiring a production-related change to firmware), or a customer of a system vendor (e.g. an end user performing a field upgrade of an SSD previously in use by the end user).

In some embodiments and/or usage scenarios, a firmware update includes information and/or operations to change a previously produced SSD (e.g. an SSD with previously downloaded firmware) from one configuration and/or set of behaviors to another. For example, an appendix is appended to a firmware image to enable modifying behaviors otherwise fixed at production time (e.g. by System Vendor Desired Drive Settings 704 via Configuration Manager 712 of FIG. 7A) via a firmware update.

Figure 7D:
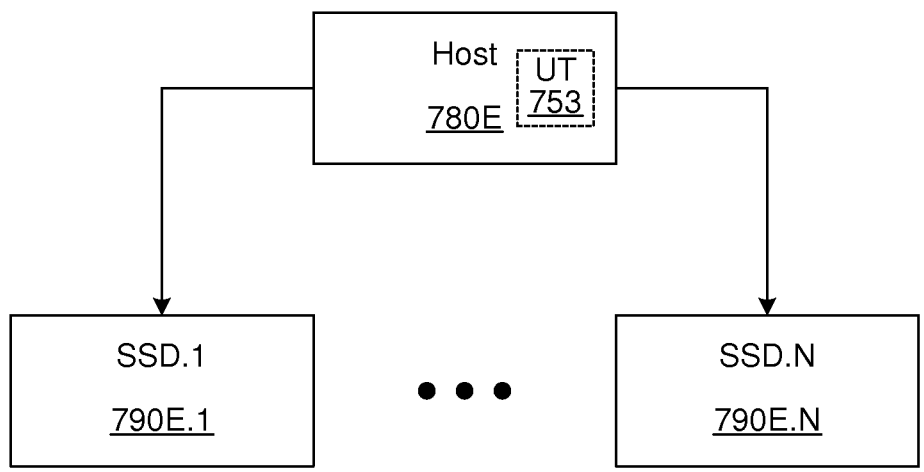
FIG. 7D illustrates selected details of an embodiment of a system for firmware updating of SSDs in accordance with a virtual drive manufacturing model.

FIG. 7D illustrates selected details of an embodiment of a system for firmware updating of SSDs in accordance with a virtual drive manufacturing model.

Similarly to FIG. 7B, a computing host, such as a workstation computer, a PC, a laptop computer, or a notebook computer (Host 780E) is coupled to one or more SSDs (illustrated as SSD.1 790E.1 . . . SSD.N 790E.N). The computing host is enabled to execute SSD update tool application software (e.g. SSD Update SoftWare Tool (UT) 753 as illustrated in Host 780E and as further illustrated in another context in FIG. 7C). As in FIG. 7B, embodiments are contemplated having any number of SSDs coupled to a single host, as well as embodiments with a plurality of hosts, each of the hosts coupled to a respective group of one or more SSDs. In embodiments having a plurality of SSDs coupled to a single host, the single host is optionally enabled, via the SSD update software tool, to direct firmware updating (e.g. downloading) to any number of the coupled SSDs wholly or partially in parallel.

In operation, Host 780E executes SSD Update SoftWare Tool (UT) 753 to update (e.g. download) firmware into any one or more of SSD.1 790E.1 . . . SSD.N 790E.N, thus transforming one or more SSDs with old firmware into one or more SSDs with new firmware (as illustrated by (Old) FirmWare Loaded SSD 750X, SSD Update SoftWare Tool (UT) 753, and (New) Firmware Loaded SSD 750Y of FIG. 7C).

In some embodiments and/or usage scenarios, one or more functions/operations (e.g. production of Manufacturing Firmware Package 721 and/or Field Update Firmware Package 723) performed by Package Manager 711 and/or one or more functions/operations (e.g. production of Drive Configuration and Settings File 722) performed by Configuration Manager 712 are unlocked and/or enabled via one or more keys, vendor identifiers, firmware override strings, and/or various security techniques (Encryption Key(s) 702).

In various embodiments and/or usage scenarios, either one or both of Host 780P of FIG. 7B and Host 780E of FIG. 7D are identical to or a variation of Host 102 of FIG. 1B. In various embodiments and/or usage scenarios, any one or more of SSD.1 790P.1 . . . SSD.N 790P.N of FIG. 7B and SSD.1 790E.1 . . . SSD.N 790E.N of FIG. 7D are identical to or variations of SSD 101, as illustrated, e.g., in FIG. 1B.

Selected Example VDMM Implementation Techniques

In some embodiments and/or usage scenarios, one or more elements of FIGS. 6 and 7A-7D or portions thereof are performed wholly or partially via one or more of several computer-aided and/or computer-related techniques. For example, one or more paths between elements are implementable via any one or more of e-mail, XML-annotated specifications and/or XML-based forms, and server-to-server transactions. E.g., communication of Reference Design & Flash Recommendation 612 information to BOM Selection, BOM Procurement, and Design Approval 632 of FIG. 6 is via e-mail and/or a plurality of XML-annotated specifications. For another example, one or more elements are implementable at least in part via any one or more of any one or more tiers of a multi-tiered Internet commerce-based-server, one or more web, database, and/or application servers, and one or more web, database, and/or application scripts, programs, and/or applications. E.g. documentation relating to Controller & FirmWare 611 of FIG. 6 is made available via a website such as operable via one or more web, database, and/or application servers.

For yet another example, cryptographic key escrow technologies, such as based on encrypted communication, passwords, and/or certificates and servers thereof, are used to implement certain operations. E.g., a license server provides encrypted check-out of cryptographic keys, such as all or any portions of License File 701 of FIGS. 7A and 7C. For another example, some elements are distributed wholly or partially via one or more business to business automation systems using the Internet. E.g., distribution of Manufacturing SoftWare Tool (MT) 751 as used in FIG. 7B (and/or SSD Update SoftWare Tool (UT) 753 as used in FIG. 7D) are via a design vendor to manufacturer automation system using the Internet.

In various embodiments and/or usage scenarios, one or more elements of FIGS. 6 and 7A-7D or portions thereof are performed at various permutations of locations. For example, all operations relating to Design Vendor 610, Manufacturer 620, and System Vendor 630 (of FIG. 6) are performed at a same location. For another example, all operations relating to Design Vendor 610 are performed at a first location, all operations relating to Manufacturer 620 are performed at a second location, and all operations relating to System Vendor 630 are performed at a third location. For yet another example, some operations relating to Design Vendor 610 and System Vendor 630 are performed at a first location, and some operations relating to Manufacturer 620 and System Vendor 630 are performed at a second location. For another example, some operations relating to Engineering 730A and Factory 740F (of FIG. 7A) are performed at a plurality of locations.

LBA to NVM Location Mapping

Figure 8:
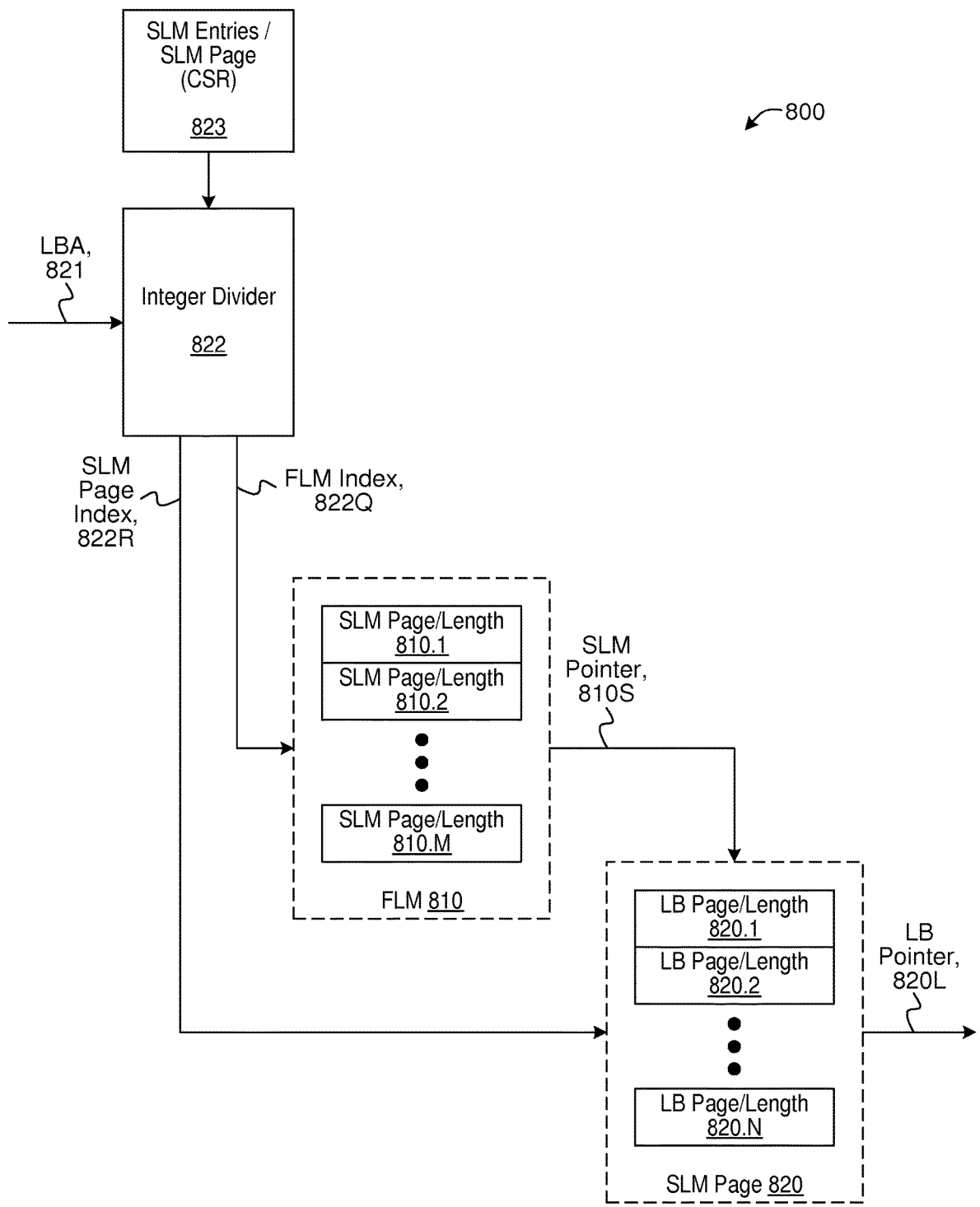
FIG. 8 illustrates selected details of an embodiment of mapping LBAs to Logical Blocks (LBs) stored in an NVM via a two-level map having a First-Level Map (FLM) and one or more Second-Level Map (SLM) pages.

FIG. 8 illustrates, as LBA to NVM Location Mapping 800, selected details of an embodiment of mapping LBAs to LBs stored in an NVM via a two-level map having an FLM and one or more SLM pages. The two-level map is implemented via a first-level element (FLM 810) coupled to one or more second-level elements (illustrated conceptually as a single element SLM Page 820). The FLM includes a plurality of entries (SLM Page/Length 810.1 . . . SLM Page/Length 810.M). Each of the entries of the FLM points to one of the SLM pages (such as SLM Page 820). The SLM page includes a plurality of entries (LB Page/Length 820.1 . . . LB Page/Length 820.N). Each of the entries of the SLM pages points to a location in the NVM where data begins (e.g. a read unit storing at least the beginning of host write data for an LBA). A divider (Integer Divider 822) receives a parameter from, e.g., a programmable hardware register (SLM Entries/SLM Page (CSR) 823), to divide an incoming LBA by to determine which FLM entry to select and which SLM entry (within the SLM page pointed to by the selected FLM entry) to select. The divider is coupled to the FLM and the SLM pages.

In various embodiments, the figure is illustrative of selected details of or related to Map 141 and/or Table 143 of FIG. 1A. For example, in some embodiments, Map 141 and/or Table 143 implement one or more caches of mapping information, such as one or more entries of an FLM and/or one or more entries of an SLM. An entire image of the FLM and/or the SLM is maintained in a portion of NVM (e.g. NVM 199 of FIG. 1A), updated, e.g., when the caches replace a previously cached FLM and/or SLM entry. In some embodiments, the FLM and/or the SLM entire images are implemented via rolling or ping-pong checkpoints, each of the checkpoints being a portion of the respective entire map image.

In operation, LBA 821 is presented to Integer Divider 822. The divider divides the LBA by a number of SLM entries per SLM page, as provided by SLM Entries/SLM Page (CSR) 823, resulting in a quotient (FLM Index 822Q) and a remainder (SLM Page Index 822R). The quotient is used to select one of the FLM entries, and a page field of the selected FLM entry is read (SLM Pointer 810S). The page field is used to select one of the SLM pages (e.g. SLM Page 820), and the remainder is used (e.g. as an offset) to select an entry of the selected SLM page. A page field of the selected SLM page entry is used to select a particular location in the NVM, such as a particular read unit, where at least the beginning of the LB corresponding to the presented LBA is stored (LB Pointer 820L). In various embodiments, the LB pointer includes an address of a read unit of the NVM (e.g. Read Unit Address 223 of FIG. 2). In some embodiments, each of the SLM entries includes a length field (e.g. encoding size and/or span) indicating how many read units to read to obtain all of the data for an LB and/or where within a read unit data for an LB begins (e.g. Length in Read Units 225 of FIG. 2). In some embodiments, each of the FLM entries includes a length field (e.g. encoding size and/or span) indicating how many read units to read to obtain all of the respective SLM page specified by the page field of the FLM entry (e.g. Length in Read Units 225 of FIG. 2).

In various embodiments, the quotient is used as a key to access a cache, such as a fully associative cache of SLM pages. If there is a hit in the cache for a particular SLM page, then a latest copy of the particular SLM page is found in the cache without accessing the NVM. Providing fast access to a plurality of SLM pages enables, in some embodiments and/or usage scenarios, more efficient processing of random accesses to NVM and/or a plurality of independent streams of sequential data accesses to NVM (e.g. a first stream of sequential data accesses to a first region of LBAs interspersed with a second stream of sequential data accesses to a second region of LBAs).

Solid-State Disk Manufacturing Self Test

An overview of an example of an SSD MST flow is as follows. A technician couples an SSD to be tested to a host (e.g. via plugging the SSD into a test host computer). Under direction of any one or more of the technician and one or more programs executing on the host, the SSD (optionally in conjunction with the host) executes a test of flash of the SSD and then saves a beginning state of a grown defect list. The flash test is, e.g., to check that connectivity with the host is functional. The beginning state of the grown defect list is, e.g., a beginning list of blocks of the flash that are inoperable. The host then configures an MST by writing an input log (e.g. a SMART log) with commands that form the test. The commands are selected from a plurality of supported MST commands executable (e.g. via firmware) by the SSD. Conceptually the supported MST commands collectively correspond to an API for interfacing with the flash of the SSD. When the host has completed the configuring, the host sends a START command (e.g. as a particular SCT command, such as MST_START) to place the SSD in MST mode and to direct the SSD to begin the test by executing the commands from the input log.

In some usage scenarios, the START command indicates to the SSD to begin the test immediately (while coupled to the host). In other usage scenarios, the START command indicates to the SSD to immediately enter a standby mode and to delay beginning the test until the next time the SSD is powered up. In at least some of the usage scenarios where the START command indicates entering the standby mode, after the SSD enters the standby mode and is powered down, the technician uncouples the SSD from the host and couples the SSD to a power source (e.g. a rack). Then the technician directs the power source to apply power to the SSD. When the SSD is powered up it begins the test.

After the test begins, the technician watches for an indicator on the SSD (e.g. a visual display such as an LED) to indicate that the test is complete. Alternatively the technician periodically powers down the SSD, uncouples the SSD from the power source, couples the SSD to the host, powers up the SSD, and via the host, queries the SSD to determine status of the test, such as whether or not the test is complete.

When the SSD has completed the test, the SSD enters a standby mode. Then the technician couples the SSD to the host (if the SSD is not already coupled to the host) and powers up the SSD. The host (e.g. under direction of the technician and/or in response to the coupling and powering on of the SSD) reads (from the SSD) and saves (e.g. to storage coupled to the host) results of the test and final state of the grown defect list. The host then sends a COMPLETE command (e.g. as a particular SCT command, such as MST_COMPLETE) to the SSD to direct the SSD to end the MST and prepares the SSD for sale to a system vendor and/or a customer.

While the foregoing is described in terms of a single technician, in various embodiments and/or usage scenarios, the technicians is a single individual, or alternatively a plurality of individuals, such as over a period of time.

In some embodiments and/or usage scenarios, an MST specifies one or more environmental parameters for control of an environmental context of an SSD subject to the MST. In some embodiments the environmental parameters are used to implement one or more voltage ramps applicable, e.g., to flash of the SSD.

Figure 9A:
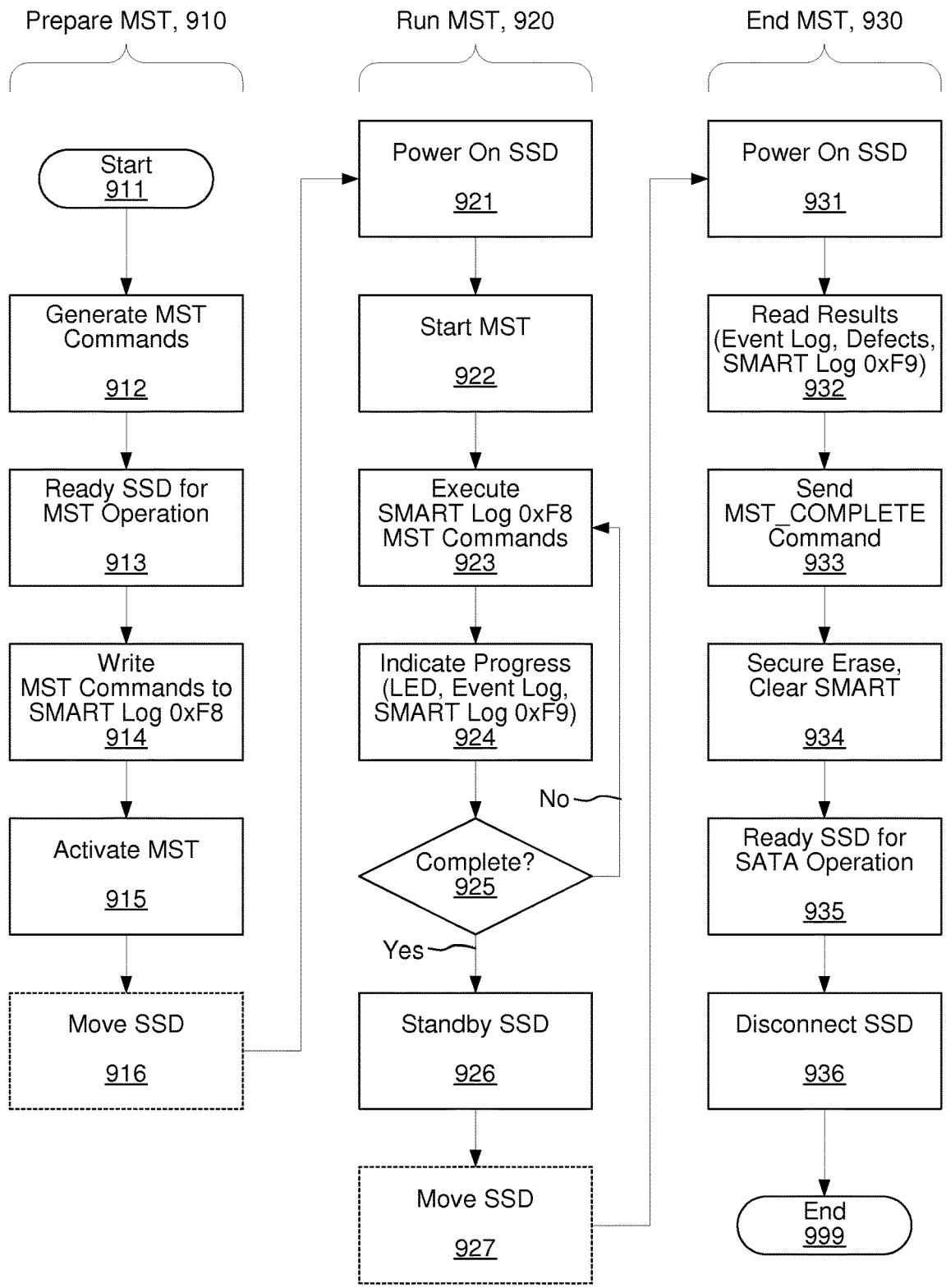
FIG. 9A illustrates selected details of an embodiment of an SSD MST flow.

FIG. 9A illustrates selected details of an embodiment of an SSD MST flow. In various circumstances, as a result of performing the flow with respect to a test on an SSD, all or any portions of user data previously stored on the SSD are erased and/or overwritten. (Examples of 'user data' in contexts of SSD MST include data received as or originating from host reads/writes, such as operating system data, driver data, and application data.) A host is used to set up and start a test in accordance with the flow. The test continues to run across power cycles of the SSD until the SSD completes the test or the host directs the SSD to end the test prematurely by sending an ABORT command (e.g. as a particular SCT command, such as MST_ABORT) to the SSD. In some embodiments, less than all flash of the SSD is exercised, e.g. only areas of the flash allocated and/or designated for storing user data, optionally including any over provisioning allocations and/or designations. In some embodiments, the host interprets results of the test (e.g. the host determines whether the test passed or failed). In various embodiments, a design vendor (such as in accordance with a virtual drive manufacturing model) provides firmware in the SSD that enables operation according to the illustrated SSD MST flow.

The flow is broadly arranged in three portions: setting up to run a test (Prepare MST 910), running the test (Run MST 920), and performing various post-completion operations after completion of the test (End MST 930). The preparation portion of the flow begins (Start 911) with creating one or more MST commands (Generate MST Commands 912), such as via test personnel crafting commands and/or executing a script on a host to create commands. In some usage scenarios (e.g. some manufacturing usage scenarios), the test is only a single Write Drive (e.g. SSD) command. The flow continues by preparing an SSD for MST operation (Ready SSD for MST Operation 913), such as including the host reading a beginning state of a grown defect list from the SSD, and the host directing the SSD to perform a secure erase and to clear one or more SMART logs. Then the host configures the SSD for performing the test by storing the commands of the test to an input SMART log of the SSD (Write MST Commands to SMART Log 0xF8 914).

The flow continues with the host directing the SSD to enter the MST mode (Activate MST 915), such as by issuing an MST_START command to the SSD. In some usage scenarios, the issued MST_START command includes a function code that indicates to the SSD to begin executing the commands of the test from the SMART log on a next power up of the SSD. In response to receiving the MST_START command, the SSD sets an MST flag. The SSD is now enabled to perform the test stored in the input SMART log without further interaction with the host (e.g. without a host interface, such as a SATA interface, coupled to the host). In some embodiments, the host polls an output SMART log of the SSD (e.g. SMART Log 0xF9) until a Test State indicator stored in the output SMART log by the SSD indicates that the SSD has entered and/or activated the MST mode. In response to the host determining that the SSD has entered/activated the MST mode, the host directs the SSD to immediately enter a standby mode and then powers down the SSD. When the SSD is powered down, the SSD is uncoupled from the host and coupled to a power source (Move SSD 916), such as by test personnel repositioning the SSD from the host to a rack, e.g. dedicated to MST operations.

In some usage scenarios, uncoupling the repositioning (Move SSD 916) is omitted, and the test is performed while the SSD remains coupled to the host. In some usage scenarios, the issued MST_START command includes a function code that indicates to the SSD to immediately begin executing the commands, such as while remaining coupled to the host.

After issuing the MST_START command and subsequent optional repositioning of the SSD as coupled to the rack, the preparation portion of the flow (Prepare MST 910) is complete and the running portion (Run MST 920) begins. The flow proceeds to apply power to the SSD (Power On SSD 921), such as via the host or the rack. In response to the application of power, the SSD begins operation in the MST mode (Start MST 922), and begins to fetch and execute the commands from the input SMART log (Execute SMART Log 0xF8 MST Commands 923). While in the MST mode, the SSD disables processing of data commands (e.g. SATA data commands). Further while in the MST mode, the SSD responds to identification queries as indicating operation in the MST mode (e.g. by responding to a SATA Identify Drive query by showing a "T" in the 7$^{th}$ character of the Ident string). While executing the commands of the test, the SSD provides and/or records progress, status, and/or result information (Indicate Progress (LED, Event Log, SMART Log 0xF9) 924). In various embodiments and/or usage scenarios, any one or more of the progress, the status, and the result information include accumulated statistics. In various circumstances, one or more of a number of errors, error location(s), and how many of the commands have been processed are included. Unless instructed to end the test prematurely (e.g. by the host directing the SSD to abort the test via an MST_ABORT command), the SSD continues to fetch and execute the commands of the test until an end indication specified in the test (e.g. via one or more input parameters) is met (Complete? 925). When the test is completed, the SSD indicates that the test is completed (e.g. via the LED such as by ceasing blinking, via the Event, Log, and/or via the SMART Log 0xF9) and enters an idle mode (Standby SSD 926), such as via the firmware ceasing all operations of the SSD.

If the SSD is running the test while coupled to the host, then in some usage scenarios the host reads the progress, status, and/or result information (such as the output SMART log) to determine when the test has completed. If the SSD is running the test while coupled to the host or the rack, then test personnel, in some usage scenarios, observe the LED to determine when the test has completed. When the test is completed, if the SSD was moved from the host to the rack (Move SSD 916), then the SSD is powered down, uncoupled from the rack, and coupled to the host (Move SSD 927), such as by test personnel repositioning the SSD from the rack to the host.

After completing the test and optionally repositioning the SSD as coupled to the host, the running portion of the flow (Run MST 920) is complete and the various completion-operations portion (End MST 930) begins. The flow proceeds to apply power to the SSD if not already applied (Power On SSD 931), such as via the host. The host reads all or any portions of the progress, the status, and/or the result information of the test from the SSD (Read Results (Event Log, Defects, SMART Log 0xF9) 932). In some embodiments, the result information includes a final state of the grown defect list. After the host has completed reading the progress, the status, and/or the result information, the host requests that the SSD exit the MST mode (Send MST_COMPLETE Command 933). The host then directs the SSD to clean up after the test (Secure Erase, Clear SMART 934), such as by sending one or more erase and/or SMART log commands to the SSD. The host then powers down the SSD, leaving the SSD in a state such that on a next power on, the SSD is enabled to receive and process data commands, such as SATA data commands (Ready SSD for SATA Operation 935). Test personnel then uncouple the SSD from the host (Disconnect SSD 936). After the uncoupling, the various completion-operations portion (End MST 930) of the flow is complete, and the entire flow is complete (End 999). The SSD is now prepared for sale to a system vendor and/or a customer.

In some embodiments and/or usage scenarios (e.g. when the SSD remains coupled to the host while performing the test), the host directs the SSD to end the test prematurely by sending an ABORT command (e.g. as via a particular SCT command) to the SSD. In response, the SSD ceases execution of the commands of the test and enters an idle mode.

After direction from the host to enter the MST mode, and before test completion or abortion, the SSD resumes the test after a power down and power up cycle. Specifically, if there is a power down while the SSD is in any of 923, 924, and 925, then on a next power up the SSD resumes the test where performing of the test was suspended due to the power down.

In various embodiments and/or usage scenarios, the host archives all or any portions of the progress, the status, and/or the result information read from the SSD (such as the event log and the final state of the grown defect list). In various embodiments and/or usage scenarios, the host archives all or any portions of the input log (such as one or more of the commands of the test). In various embodiments and/or usage scenarios, the host interprets all or any portions of the various information elements read from the SSD (such as via execution of one or more scripts, programs, and/or analysis tools).

In some embodiments and/or usage scenarios (such as in a production flow), the creation of the commands that form the test (Generate MST Commands 912) is performed once for a group of SSDs, such as a collection of SSD instances forming a production run or a collection of SSD instances from a same product line. The remainder of the flow illustrated in the figure is performed for each of the SSD instances. The flow (or variations thereof) is not limited to use in production (e.g. manufacturing). In various embodiments and/or usage scenarios, the flow (or variations thereof) is used as part of any one or more of burn-in, quality assurance services/operations, failure analysis, and/or RMA/ servicing operations.

In various embodiments and/or usage scenarios, one or more of the particular SCT commands (e.g. START, COMPLETE, and ABORT) are vendor-specific.

Figure 9B:
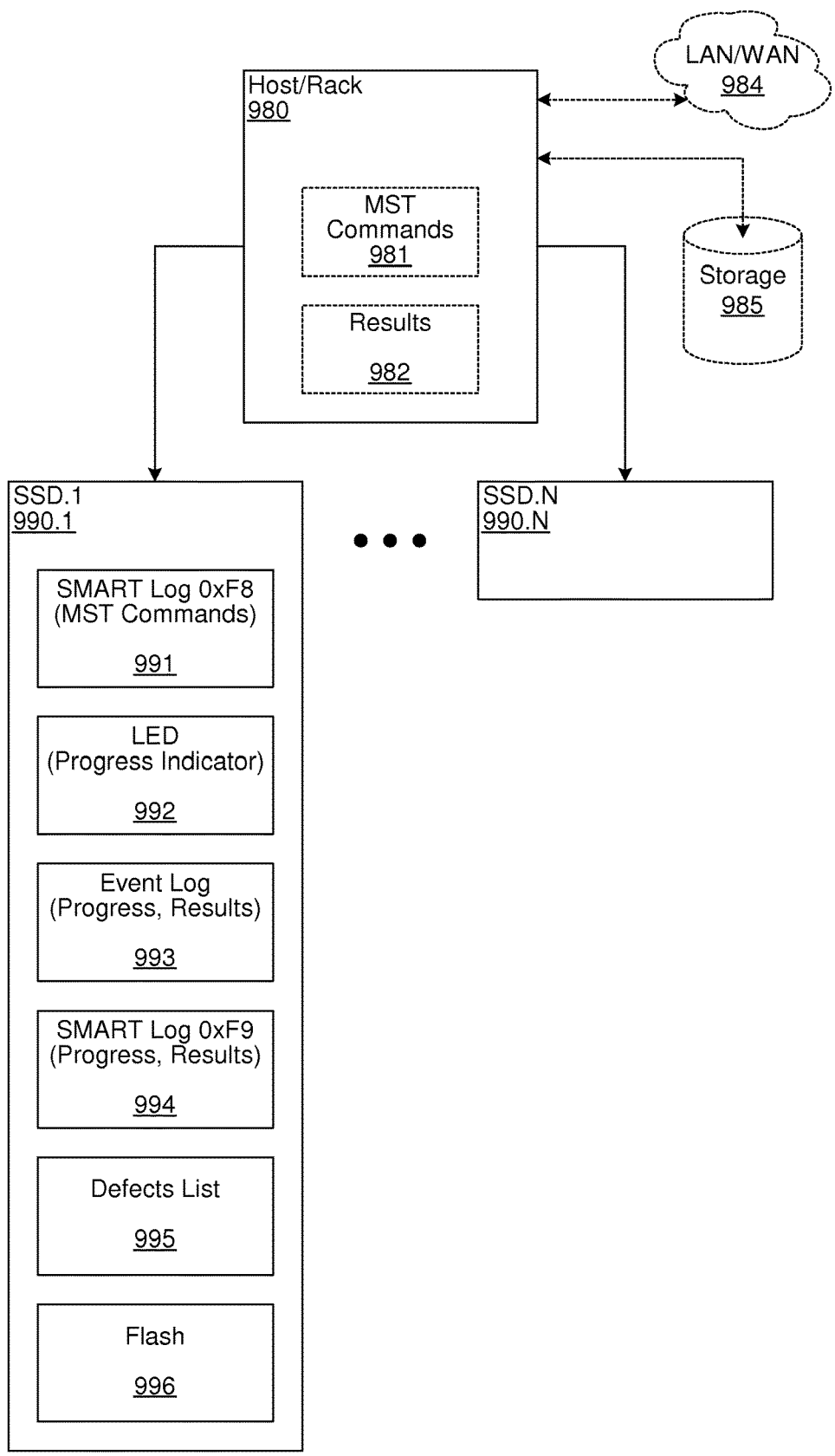
FIG. 9B illustrates selected details of an embodiment of a system for performing one or more MSTs on one or more SSDs.

FIG. 9B illustrates selected details of an embodiment of a system for performing one or more MSTs on one or more SSDs, e.g. as described with respect to FIG. 9A. The system includes Host/Rack 980 coupled to one or more SSDs illustrated as SSD.1 990.1 . . . SSD.N 990.N. In some embodiments and/or usage scenarios, the illustrated Host/

Rack is representative of a computing host used for a duration of an MST performed by the SSDs (e.g. to prepare, run, and end the MST). In some embodiments and/or usage scenarios, the illustrated Host/Rack is representative of a computing host used for beginning and ending portions of an MST performed by the SSDs (e.g. to prepare and end the MST), and representative of a power-supplying test rack for a middle portion of the MST (e.g. to run the MST). The Host/Rack is enabled to provide commands and/or data to the SSDs, and to receive information and/or data from the SSDs. The Host/Rack is enabled to provide power to the SSDs but unable to provide commands and/or data to the SSDs.

The Host/Rack is coupled to LAN/WAN 984 to enable communication with computing and storage resources elsewhere, via, e.g., the Internet. The Host/Rack is coupled to Storage 985 to enable retention of various tests for application to the SSDs as well as results from application of the tests to the SSDs. The Host/Rack conceptually includes at least one SSD test illustrated as MST Commands 981. The Host/Rack conceptually includes at least one collection of results of at least one of the SSDs performing at least one MST, illustrated as Results 982. While illustrated "within" the Host/Rack 980, in various embodiments and/or usage scenarios, MST Commands 981 and/or Results 982 are retained in remote resources accessible via LAN/WAN 984, and/or retained in all or any portions of Storage 985.

SSD.1 990.1 includes one or more NVMs to implement mass storage, illustrated as Flash 996. SSD.1 990.1 implements particular capabilities relating to MST. In various embodiments the particular capabilities are implemented by various combinations of any one or more of hardware, software, and firmware. The particular capabilities include any one or more of SMART Log 0xF8 (MST Commands) 991, LED (Progress Indicator) 992, Event Log (Progress, Results) 993, SMART Log 0xF9 (Progress, Results) 994, and Defects List 995. While illustrated as separate elements, in various embodiments, one or more of the capabilities are implemented in a same element. For example, SMART Log 0xF8 (MST Commands) 991 and/or SMART Log 0xF9 (Progress, Results) 994 are implemented in a portion of Flash 996, such as a portion that is separate from portions of the Flash used to store host data associated with particular LBAs. For another example, Event Log(Progress, Results) 993 is implemented in a portion of Flash 996.

In various embodiments, any one or more of SMART Log 0xF8 (MST Commands) 991, Event Log (Progress, Results) 993, SMART Log 0xF9 (Progress, Results) 994, and Defects List 995 are implemented via all or any portions of a device memory of an SSD. One or more locations of the SSD device memory are addressable via an SSD device memory space that is separate from a memory space associated with host LBAs. The SSD device memory space is accessible to the host via one or more commands provided by the host via a host interface of the SSD. For example, a host provides commands to read/write device memory of an SSD via a SATA interface of the SSD.

SMART Log 0xF8 (MST Commands) 991 provides storage for the commands of the tests provided by Host/Rack 980. When performing the tests, SSD.1 990.1 fetches and executes the commands from SMART Log 0xF8 (MST Commands) 991. LED (Progress Indicator) 992 provides an indication of whether or not the test has completed. Event Log (Progress, Results) 993 and SMART Log 0xF9 (Progress, Results) 994 provide storage for progress indications and results of the test. SSD.1 990.1 is enabled to provide Host/Rack 980 with access to Event Log (Progress, Results) 993 and SMART Log 0xF9 (Progress, Results) 994. For example, when the test is running, the Host/Rack accesses the Even Log to determine whether or not the test has completed. For another example, when the test is completed, the Host/Rack accesses the SMART Log 0xF9 to obtain results of the test as stored by SSD.1 990.1 while performing the test. Defects List 995 provides storage for a list of inoperable or relatively poorly performing blocks of Flash 996. SSD.1 990.1 is enabled to provide Host/Rack 980 with access to Defects List 995. For example, after the test is completed, the Host/Rack accesses the Defects List to archive information about the SSD for potential later analysis.

While not explicitly illustrated, SSD.1 990.N includes elements similar or identical to SSD.1 990.1.

In some circumstances, an MST test fails, such as due to a catastrophic SSD failure or inability to make progress in the MST test. Failure sources include a firmware 'panic', incorrect data in an input SMART log, and a cycle time exceeding a timeout value. In some usage scenarios, the MST test includes criteria (expressed, e.g., as parameters) specifying one or more conditions that indicate failure. The criteria include a number of correctable lower-level and/or higher-level ECC errors, a number of uncorrectable lower-level and/or higher-level ECC errors, a number of program errors, a number of erase errors, and a ratio of bit errors to error-free reads.

In various embodiments, some elements of FIG. 9B are related to operations described by some elements of FIG. 9A. For example, Host/Rack 980 of FIG. 9B performs any one or more of the operations of FIG. 9A performed by a host and/or a rack. Any one or more of SSD.1 990.1 . . . SSD.N 990.N of FIG. 9B are representative of objects of operations of FIG. 9A performed by or with respect to an SSD. Similarly, particular elements of SSD.1 990.1 of FIG. 9B are related to particular elements of FIG. 9A. For example, SMART Log 0xF8 (MST Commands) 991 of FIG. 9B is an embodiment of the Smart Log 0xF8 appearing in Write MST Commands to SMART Log 0xF8 914 and Execute SMART Log 0xF8 MST Commands 923 of FIG. 9A. For another example, LED (Progress Indicator) 992 of FIG. 9B is an embodiment of the LED of Indicate Progress (LED, Event Log, SMART Log 0xF9) 924. For another example, Event Log (Progress, Results) 993 of FIG. 9B is an embodiment of the Event Log of Indicate Progress (LED, Event Log, SMART Log 0xF9) 924 and Read Results (Event Log, Defects, SMART Log 0xF9) 932 of FIG. 9A. For another example, SMART Log 0xF9 (Progress, Results) 994 of FIG. 9B is an embodiment of the SMART Log 0xF9 of Indicate Progress (LED, Event Log, SMART Log 0xF9) 924 and Read Results (Event Log, Defects, SMART Log 0xF9) 932 of FIG. 9A. For another example, Defects List 995 of FIG. 9B is an embodiment of the Defects of Read Results (Event Log, Defects, SMART Log 0xF9) 932 of FIG. 9A.

In various embodiments, all or any portions of the elements of FIG. 1A and/or FIG. 1B are example embodiments of all or any portions of the elements of FIG. 9A and FIG. 9B. For example, SSD 101 of FIG. 1A and FIG. 1B is an example embodiment of the SSD referred to with respect to operations of FIG. 9A and any one or more of SSD.1 990.1 . . . SSD.N 990.N of FIG. 9B. For another example, Host 102 of FIG. 1B is an example embodiment of the host and/or the rack with respect to operations of FIG. 9A and of Host/Rack 980 of FIG. 9B. For another example, CPU 171 of FIG. 1A is an example embodiment of a processor enabled to execute the firmware referred to with respect to operations of FIG. 9A and elements of FIG. 9B. For another example, FW 106 of FIG. 1B is an example embodiment of the firmware referred to with respect to operations of FIG. 9A and elements of FIG. 9B.

In various embodiments, all or any portions of the flow described by FIG. 9A are example embodiments of all or any portions of tests of an SSD (e.g. factory tests and/or MST) as described with respect to the contexts of FIG. 6 and/or FIG. 7. In various embodiments and/or usage scenarios, all or any portions of the flow described by FIG. 9A (such as operations performed by the host) are implemented via Manufacturing SoftWare Tool 616 of FIG. 6. In various embodiments, all or any portions of FIG. 9B are example embodiments of all or any portions of FIG. 7B (e.g. Host/Rack 980 is an example embodiment of Host 780P, and SSD.1 990.1 . . . SSD.N 990.N are example embodiments of SSD.1 790P.1 . . . SSD.N 790P.N).

Figure 10:
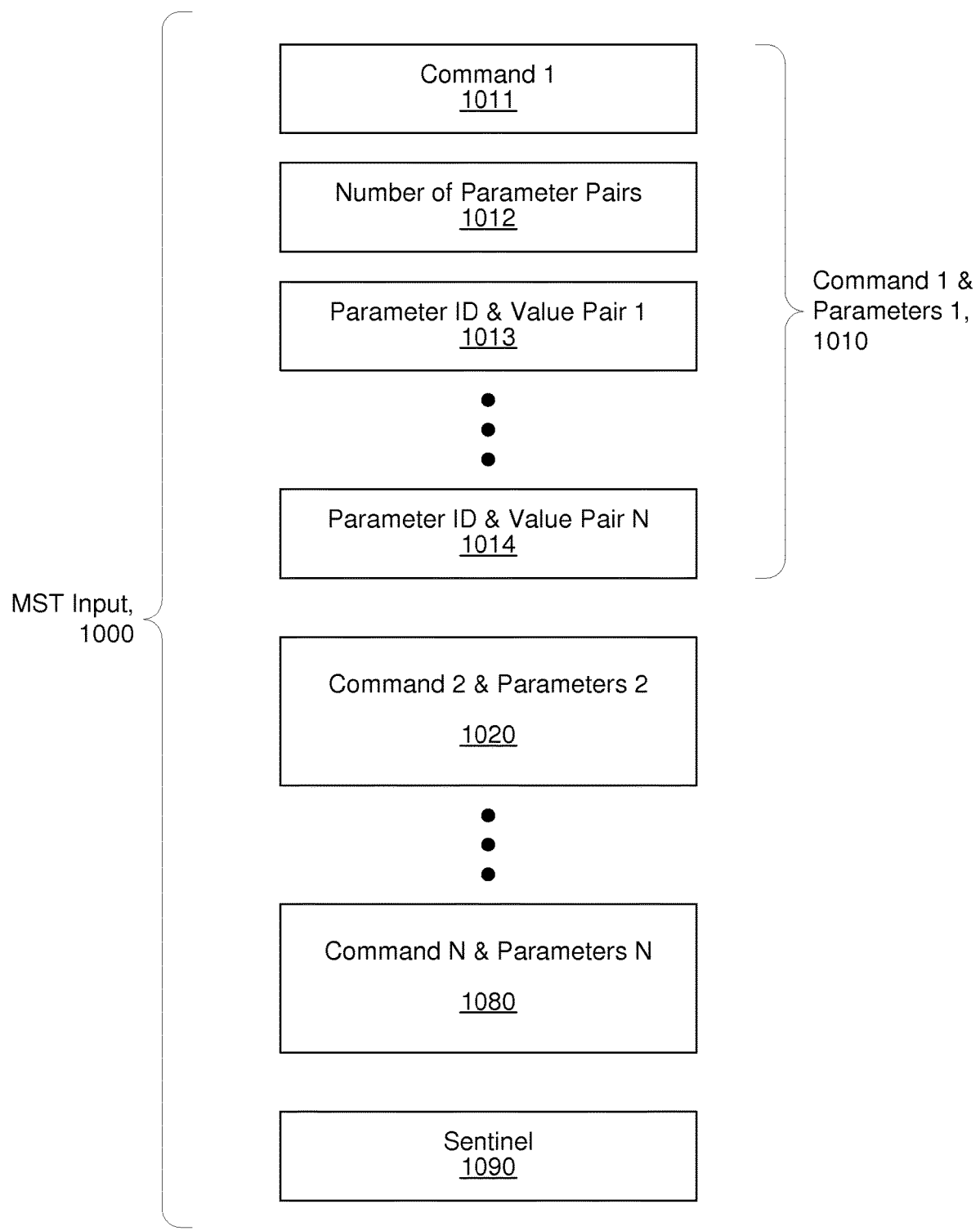
FIG. 10 illustrates selected details of an embodiment of MST commands as well as associated numbers of parameter pairs and parameter identifier/value pairs.

FIG. 10 illustrates selected details of an embodiment of MST commands as well as associated numbers of parameter pairs and parameter identifier/value pairs. An entire MST (e.g. MST Input 1000) is a sequence of commands having one or more commands and an end marker. In various embodiments, MST Input 1000 is representative of commands stored by a host in an input SMART log of an SSD to be tested (e.g. as in Write MST Commands to SMART Log 0xF8 914 of FIG. 9A and/or SMART Log 0xF8 (MST Commands) 991 of FIG. 9B) as well as fetched and executed by the SSD (e.g. as in Execute SMART Log 0xF8 MST Commands 923 of FIG. 9A).

Each command is followed by a number indicating how many parameter pairs follow the number, and the number is followed by zero or more parameter identifier and value pairs. The last command is followed by an end marker. In some usage scenarios, an MST includes a single command, optionally with one or more parameter identifier and value pairs. In some usage scenarios, an MST includes any number of commands, each with respective parameter information, and the number of commands is limited only by a size of the input SMART log of the SSD to be tested.

As specifically illustrated in the figure, MST Input 1000 includes N commands (Command 1 & Parameters 1 1010, Command 2 & Parameters 2 1020 . . . Command N & Parameters N 1080) followed by an end marker (Sentinel 1090). The SSD recognizes the Sentinel as an indicator that no more commands are present in the MST (e.g. by firmware processing the MST Input), and in response the SSD indicates the test is completed enters an idle mode (e.g. as in Standby SSD 926 of FIG. 9A).

Command 1 & Parameters 1 1010 is illustrated in detail as having a command (Command 1 1011) followed by a portion indicating how many parameter pairs follow (Number of Parameter Pairs 1012), and ending with the parameter pairs as parameter identifier value pairs (Parameter ID & Value Pair 1 1013 . . . Parameter ID & Value Pair N 1014). In various usage scenarios, Command 1 & Parameters 1 1010 is the only command in an MST or alternatively is the first of a plurality of commands in an MST. In some various scenarios, Number of Parameter Pairs 1012 is zero (Parameter ID & Value Pair 1 1013 . . . Parameter ID & Value Pair N 1014 are omitted), Number of Parameter Pairs 1012 is one (only Parameter ID & Value Pair 1 1013 is present for Command 1 & Parameters 1 1010), and so forth. While not illustrated explicitly, Command 2 & Parameters 2 1020 . . . Command N & Parameters N 1080 each have respective portions indicating how many respective parameter pairs follow each command, as well as the respective parameter identifier/value pairs.

Figure 11:
FIG. 11 illustrates selected details of an embodiment of various commands usable in MSTs.

FIG. 11 illustrates selected details of an embodiment of various commands usable in MSTs (e.g. supported MST commands executable via firmware). MST Commands 1100 illustrates a command code, a command name, and a command description for a plurality of commands. The MST Commands are usable as commands in formulating an MST, such as illustrated as MST Input 1000 of FIG. 10. The commands described by the figure include Write Drive 1101, Erase Drive 1102, SATA PHY Burn-In 1103, Delay 1104, and Stress Mode 1105. Other commands are contemplated, such as commands to perform flow control within an MST, e.g. looping and/or branching commands. In the context of FIG. 11, an SSD (as described elsewhere herein) is an example of a 'drive'.

FIG. 12 illustrates selected details of an example of an MST. Example MST Input 1200 illustrates commands and associated descriptions for a plurality of commands and an end marker that collectively form the example MST. The example MST is suitable for use as a sequence of MST commands as stored by a host in an input SMART log of an SSD to be tested (e.g. as in Write MST Commands to SMART Log 0xF8 914 of FIG. 9A and/or SMART Log 0xF8 (MST Commands) 991 of FIG. 9B) as well as fetched and executed by the SSD (e.g. as in Execute SMART Log 0xF8 MST Commands 923 of FIG. 9A). In the context of FIG. 12, an SSD (as described elsewhere herein) is an example of a 'DRIVE' and a 'drive'.

FIGS. 13A-D illustrate selected details of an embodiment of an implementation of a write drive command (e.g. Write Drive 1101 of FIG. 11) in a specific usage scenario. Conceptually, an SSD executing the write drive command (e.g. during MST processing) operates on flash of the SSD in portions, such as a plurality of R-blocks. FIGS. 13A-D illustrate the flash of the SSD as the plurality of R-blocks, and each of the figures corresponds to a respective time and a corresponding state of the R-blocks. The mnemonic 'Sys' corresponds to an R-block associated with system data (e.g. some or all map tables). The mnemonic 'Usr' corresponds to an R-block associated with user data (e.g. received as or originating from host reads/writes). The dotted-line large 'X' corresponds to an R-block that is 'bad' (e.g. inoperable, defective, and/or characterized by a relatively high error rate). The mnemonic 'Pat' corresponds to an R-block written via execution of the write drive command (e.g. by firmware of the SSD) such as with a specific pattern, a selected one of a plurality of specific patterns, and/or a computed pattern.

The write drive command executes in iterations, conceptually stepping writes across one or more R-blocks during each iteration. In the embodiment illustrated by FIGS. 13A-D, only R-blocks associated with user data are subject to the writes (e.g. R-blocks associated with system data are preserved). As the execution of the write drive command progresses, the SSD (e.g. via firmware) periodically gathers and records statistics, and checks/verifies that no R-blocks have been unintentionally erased. In some embodiments, the progress of the write drive command is measured in cycles, each cycle corresponding to writing all of the R-blocks associated with user data at least once. When the iterations of the write drive command are complete, the SSD (e.g. via the firmware), checks/verifies that no R-blocks have been unintentionally erased and/or that all R-blocks have been correctly programmed.

Figure 13A:
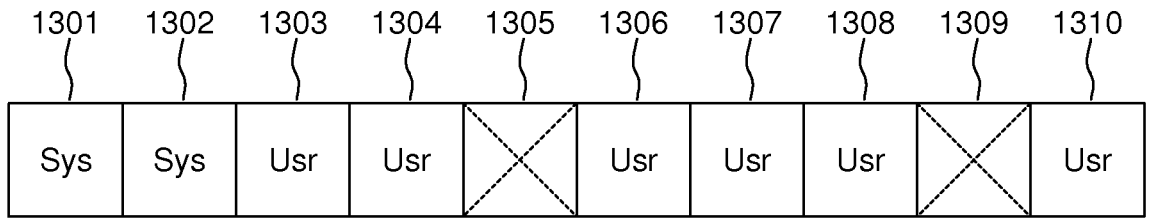
FIGS. 13A-D illustrate selected details of an embodiment of an implementation of a write drive command in a specific usage scenario.

FIG. 13A illustrates the flash of the SSD as R-Blocks 1301-1310 in an initial state, corresponding to a time before any changes due to execution of the write drive command. R-Blocks 1303, 1304, 1306-1308, and 1310 are allocated to and/or contain user data (as illustrated by the Usr mnemonic). Since the write drive command has not yet changed any of the R-blocks, there are no R-blocks written via execution of the write drive command. R-Blocks 1301 and 1302 are allocated to and/or contain system data (as illustrated by the Sys mnemonic). In the illustrated embodiment, the write drive command modifies only R-blocks associated with user data, and therefore R-Blocks 1301 and 1302 remain associated with system data throughout the execution of the write drive command and are not further discussed with respect to FIGS. 13B-D. R-Blocks 1305 and 1309 are bad (as illustrated by the dotted-line large X). In the illustrated usage scenario, no additional bad R-blocks are discovered (and none of the previously bad R-blocks are somehow repaired). Therefore R-Blocks 1305 and 1309 remain the only bad R-blocks throughout the execution of the write drive command and are not further discussed with respect to FIGS. 13B-D.

Figure 13B:
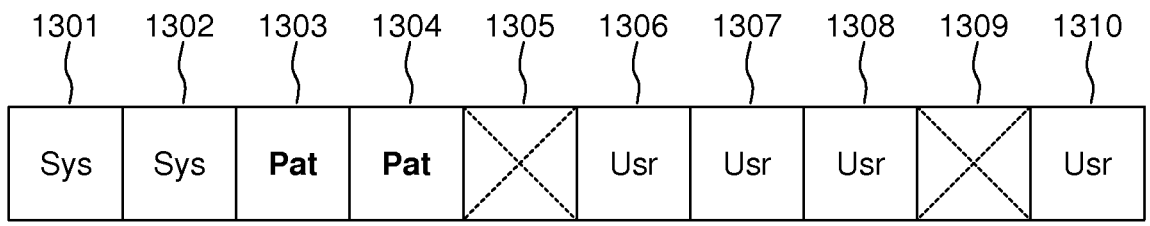

FIG. 13B illustrates R-Blocks 1301-1310 in a first-iteration state, corresponding to a time after a first iteration of the write drive command. R-Blocks 1303 and 1304 now contain respective patterns written by the first iteration of the write drive command (as illustrated by the Pat mnemonic). R-Blocks 1306-1308 and 1310 are not yet modified by execution of the write drive command and remain associated with user data (as illustrated by the Usr mnemonic).

Figure 13C:
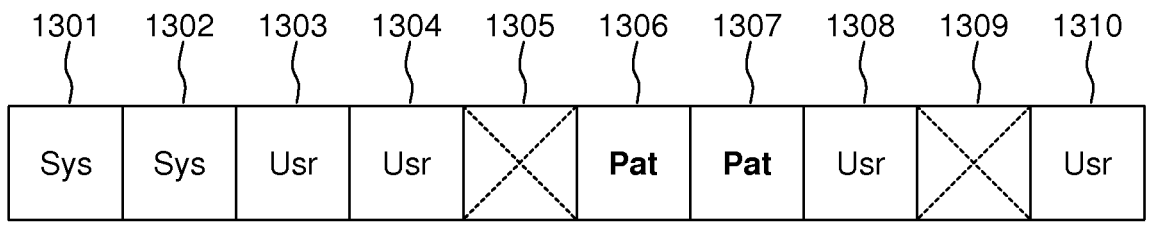

FIG. 13C illustrates R-Blocks 1301-1310 in a second-iteration state, corresponding to a time after a second iteration of the write drive command. R-Blocks 1306 and 1307 now contain respective patterns written by the second iteration of the write drive command (as illustrated by the Pat mnemonic). R-Blocks 1303 and 1304 are associated with user data (as illustrated by the Usr mnemonic), but any user data stored therein before execution of the write drive command has been overwritten (e.g. by the first iteration of the write drive command). R-Blocks 1308 and 1310 are not yet modified by execution of the write drive command and remain associated with user data (as illustrated by the Usr mnemonic).

Figure 13D:
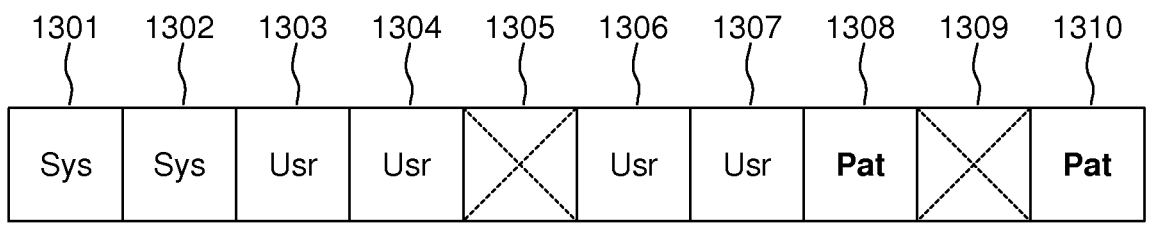

FIG. 13D illustrates R-Blocks 1301-1310 in a final state, corresponding to a time after completion of the write drive command. R-Blocks 1308 and 1310 now contain respective patterns written by the final iteration of the write drive command (as illustrated by the Pat mnemonic). R-Blocks 1303, 1304, 1306, and 1307 are associated with user data (as illustrated by the Usr mnemonic), but any user data stored therein before execution of the write drive command has been overwritten (e.g. by the first or the second iterations of the write drive command).

In various embodiments and/or usage scenarios, a write drive command has zero or more parameters, as described in the following table. Note that all of the parameters in the table are optional.

---

Number of cycles
Run time in seconds
Data pattern (if unspecified, then a random pattern is used)
Skip blocks (faster cycle for debug); default = 0 (no skip), 1 = skip
Keep processing of SATA data commands disabled
after test end; default = 0 (enable processing), 1 = keep disabled; in some manufacturing implementations the value is 1
Blink fault LED; default = 0 (blink activity LED), 1 = blink fault LED
Burn-in SATA PHY
0 = No SATA PHY burn-in (default)
1 = Burn-in at 1.5 Gbps
2 = Burn-in at 3 Gbps
3 = Burn-in at 6 Gbps
Cycle timeout in seconds; e.g. maximum time a single cycle takes before MST abort with an error; default = 0 (no timeout)

-continued

Bit error threshold; e.g. bit errors >= the bit error threshold are reported as error events; if unspecified, then the default is 16
Pick random blocks for writing; if 0 or unspecified, then blocks are spicked for writing as sequentially as possible
No erase of SSD at end of test; default = 0 (erase), 1 = no erase
Record cycle start time as MST event; default = 0 (no recording)

---

In various embodiments and/or usage scenarios, a SATA PHY burn-in command has zero or more parameters, as described in the following table. Note that all of the parameters in the table are optional.

---

PHY speed
Run time in seconds
Keep processing of SATA data commands disabled after test end; default = 0 (enable processing), 1 = keep disabled; in some manufacturing implementations the value is 1
Blink fault LED; default = 0 (blink activity LED), 1 = blink fault LED

---

Consider an SSD coupled to a host via a SATA link of the SSD while executing the SATA PHY burn-in command as part of an MST test. Since the SATA link is not available while the SATA PHY burn-in command is executing, the host is unable to communicate an ABORT command to the SSD to prematurely end the test. Instead the SSD is powered down to prematurely end the test. In some embodiments, the SATA PHY burn-in command is implemented at least in part via activation of a BIST capability of the SATA link, a SATA PHY of the SATA link, or both.

In some embodiments and/or usage scenarios, a stress mode command (e.g. Stress Mode 1105) enables constructing an MST that specifies specific flash accesses. In some circumstances, the specific flash accesses are sequences of accesses that are proprietary to a particular manufacturer or system vendor (e.g. either of Manufacturer 620 or System Vendor 630 of FIG. 6). The stress mode command enables the manufacturer or the system vendor to exercise an SSD in accordance with the proprietary sequence without implementing the proprietary sequence in firmware of the SSD, and thus without disclosing the proprietary sequence to a design vendor (e.g. Design Vendor 610 of FIG. 6). In some usage scenarios, the manufacturer or the system vendor uses one or more particular stress mode commands to determine inoperable blocks of flash of the SSD, e.g. by varying one or more of the parameters of one or more of the particular stress mode commands. In various usage scenarios, the proprietary sequence varies one or more of the parameters relating to any one or more of operating voltage of the flash, exercising specific cells of the flash, frequency of operations to the flash, error checking rates of the flash, topological defects of cells of the flash, and coupling between the cells of the flash. In some embodiments, the stress mode command is implemented by the firmware of the SSD to include any one or more of address, sequence, and behavior parameters, such as in conformance with command and parameter specification as illustrated by FIG. 10.

FIG. 14 illustrates selected details of an embodiment of an MST results log. MST Results Log 1400 illustrates a log field and associated log field elements for a plurality of log fields. In various embodiments, all or any portions of MST Results Log 1400 are representative of all or any portions of any one or more of an event log and a SMART log (e.g. as referenced by Indicate Progress (LED, Event Log, SMART Log 0xF9) 924 and Read Results (Event Log, Defects, SMART Log 0xF9) 932 of FIG. 9A, as well as exemplified by Event Log (Progress, Results) 993 and SMART Log 0xF9 (Progress, Results) 994 of FIG. 9B). The log fields described by the figure include Log Header 1401, Test State 1402, Progress Indicators 1403, Statistics 1404, and Errors 1405.

The following table lists selected elements of various embodiments of an MST results log. Any one or more of the elements are optional in various embodiments.

---
Total time (in seconds) since MST start command was received; counting stops when MST ends
---

MST State
  Not Activated = 0
  Activated = 1
  Running = 2
  Waiting for COMPLETE command = 3
MST Result
  No Error = 0
  Reserved = 1-3
  Aborted = 4
  Invalid input = 5
  Cycle timed out = 6
  Log read failed = 7
Current byte offset in input log
Current command being run
Number of cycles required by current command
Number of cycles completed in current command
Number of R-blocks tested in current cycle
Number of R-blocks remaining to be tested in current cycle
Time elapsed since test started (seconds)
Temperature at test start
Maximum temperature observed during test
Correctable higher-level and/or lower-level errors detected during test (e.g. ECCX and/or ECCcorrectable errors)
Uncorrectable higher-level and/or lower-level errors detected during test (e.g. ECCX and/or ECC uncorrectable errors)
Program and/or erase errors detected during test
Number of grown bad blocks during test; e.g. newly detected inoperable blocks
Number of blocks remapped during test
Number of read unit reads with no errors
Number of N bit errors corrected (N =1, 2, . . . and so forth to, e.g. 32)

The following table lists selected elements of various embodiments of an MST event log. Any one or more of the elements are optional in various embodiments.

| | |
|---|---|
| Program error | Reported and/or logged information includes any one or more of temperature, time and/or cycle of occurrence, success and/or failure |
| Erase error | |
| Higher-level error correction (e.g. ECCX) | |
| Bit error beyond bit error threshold | address, and number of bits in error |
| Block and/or R-block unintentionally erased | |
| New cycle | |

Other Embodiment Information

In various embodiments, an SSD (such as SSD.1 990.1 of FIG. 9B) implements processing of MST commands (such as MST Commands 1100 of FIG. 11) at least in part via firmware. The firmware includes various modules, such as modules for executing in user space (e.g. at a relatively lower privilege level) and modules for executing in core space (e.g. at a relatively higher privilege level). In some embodiments, the user space modules include parsing and command executing modules. In some embodiments, the core space modules include hardware coordinating modules, such as related to a recycler (e.g. Recycler 151 of FIG. 1A). In some embodiments, portions of the firmware that are specific to processing of MST commands and/or operation in the MST mode include 'tentacles' into error handling and/or reporting routines, or other routes not otherwise specifically related to the MST mode.

The following table lists selected example routines of the firmware implementing all or any portions of the MST mode.

---

SCT command handlers for the START, ABORT, and COMPLETE commands
User space state machine operable as an MST engine parsing the input SMART log and executing commands from the log
Core space module that responds to requests from user space
Tentacles into other portions of the firmware to change behavior when the SSD is in the MST mode
Disable entry into a power save mode
Disable recovery of a SATA if the link is down
Report statistics for MST (e.g. bit error counts after every read operation)
Record error events in an output MST log (e.g. program errors, erase errors, and higher-level ECC events)
Report recycled (e.g. read completed) R-block for MST
Perform extra error checking (e.g. check whether a block with data is not erased due to incorrect operation of flash)

The following table lists selected example API entry points between the user space and the core space (the entry points are implemented by the firmware implementing all or any portions of the MST mode).

| Mnemonic | Description |
|---|---|
| MST_START_NEW_COMMAND | Starting a new command in input log; do cleanup and initialization |
| MST_POPULATE_COMPLETE | Writing of initial data pattern to drive has completed; turn compression back on |
| MST_CHECK_WRITE_COMPLETE | Check whether Write activity is still going on before aborting |
| MST_NEW_WRITE_CYCLE | Start a new Write cycle; do cleanup and initialization |
| MST_START_ERASE | Start the Erase Drive command |
| MST_CHECK_RBLOCKS_NOT_ERASED | Check whether blocks that are supposed to have data are not accidentally erased due to incorrect operation of flash |
| MST_GET_RAND_NUM | Get a random number (user space has no random number generator) |
| MST_END_COMMAND | Current MST command has ended; do cleanup |
| MST_COMPLETE | MST has ended |
| MST_RESET_PHY | Reset SATA PHY (called when PHY burn-in command ends) |

-continued

| Mnemonic | Description |
|---|---|
| MST_TURN_INDICATOR_LED_OFF | Turn off LED |
| MST_GET_ERROR_STATS | Read error statistics |

Example Implementation Techniques

In some embodiments, various combinations of all or portions of operations performed by an I/O device or portion(s) thereof, for instance an SSD and/or an SSD controller suitable for use with an SSD MST of an I/O device such as a storage I/O device including one or more SSDs, e.g., with flash memories, a computing-host flash memory controller, and/or an SSD controller (such as SSD Controller 100 of FIG. 1A), and portions of a processor, microprocessor, system-on-a-chip, application-specific-integrated-circuit, hardware accelerator, or other circuitry providing all or portions of the aforementioned operations, are specified by a specification compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments, the processing includes any combination of interpretation, compilation, simulation, and synthesis to produce, to verify, or to specify logic and/or circuitry suitable for inclusion on one or more integrated circuits. Each integrated circuit, according to various embodiments, is designable and/or manufacturable according to a variety of techniques. The techniques include a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

In some embodiments, various combinations of all or portions of operations as described by a computer readable medium having a set of instructions stored therein, are performed by execution and/or interpretation of one or more program instructions, by interpretation and/or compiling of one or more source and/or script language statements, or by execution of binary instructions produced by compiling, translating, and/or interpreting information expressed in programming and/or scripting language statements. The statements are compatible with any standard programming or scripting language (such as C, C++, Fortran, Pascal, Ada, Java, VBscript, and Shell). One or more of the program instructions, the language statements, or the binary instructions, are optionally stored on one or more computer readable storage medium elements. In various embodiments some, all, or various portions of the program instructions are realized as one or more functions, routines, sub-routines, in-line routines, procedures, macros, or portions thereof.

The embodiments have been described using flash memory devices as one example of non-volatile memory of an SSD. Many other types of volatile or non-volatile memory devices are applicable and usable in many of these embodiments in place of or in addition to flash memory devices, and there are embodiments that use multiple different types of memory devices. Further, the embodiments have been described using an SSD as an example of an electronic component such as a type of I/O device. The techniques described herein are equally applicable to many different electronic components, such as other types of I/O devices, computers, networking equipment, and other forms of electronic equipment.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (the callouts or numerical designators, e.g.) used to identify and reference the features and elements of the embodiments.

The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description, and are within the scope of the claims of the issued patent. For example, interconnect and function-unit bit-widths, clock speeds, and the type of technology used are variable according to various embodiments in each component block. The names given to interconnect and logic are merely exemplary, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as flash memory technology types; and the number of entries or stages in registers and buffers), are merely those of the described embodiments, are expected to track improvements and changes in implementation technology, and should not be construed as limitations.

Functionally equivalent techniques known in the art are employable instead of those described to implement various components, sub-systems, operations, functions, routines, sub-routines, in-line routines, procedures, macros, or portions thereof. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or features without altering the basic cooperation among the remaining elements. It is thus understood that much of the details disclosed are not required to implement various aspects of the embodiments described. To the extent that the remaining elements are distinguishable from the prior art, components and features that are omitted are not limiting on the concepts described herein.

All such variations in design are insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

What is claimed is:

1. A method comprising:
   connecting a storage device having an event log, a storage device controller, and storage media to an external host device;
   storing a manufacturing self test (MST) sequence of commands from the external host device to the event log;
   setting an MST flag in the storage device corresponding to instructions in an MST_START command from the external host device defining when to begin execution of the MST sequence of commands, wherein the MST flag corresponds to a next power-on event so that the storage controller executes the MST sequence of commands responsive to a subsequent transition of the storage device from a powered down state to an operationally powered state;
   the storage device self-executing the MST sequence of commands in response to the MST flag to store results of the MST sequence of commands in the event log without interaction with the host device; and
   after the MST sequence of commands is completed, the storage device transferring the results stored in the event log to the host device.

2. The method of claim 1, further comprising:
   providing a cryptographic key to a business to enable the business to decrypt firmware as one or more images from an encrypted firmware repository, the images being executable by the storage device controller included in the storage device, the images enabling execution of the commands, the storage device being constructed in accordance with a storage device reference design;
   providing access to the encrypted firmware repository to the business;
   wherein the commands comprise the MST sequence of commands; and
   wherein the storage device comprises components selected from a list of components, the list being components that are compatible with the firmware, the storage device controller, and the storage device reference design.

3. The method of claim 1, wherein the MST sequence of commands includes a grown defect test to identify grown defects in the storage media.

4. The method of claim 1, wherein the MST sequence of commands directs the storage device to execute a self test of the storage device, and wherein the method further comprises using the host device to determine whether the storage device passed the self test responsive to the transfer of the stored log information.

5. The method of claim 1, wherein the event log comprises a Self-Monitoring Analysis and Reporting Technology (SMART) log.

6. The method of claim 5, wherein the SMART log is a first SMART log and further comprising storing one or more results of the self-executing the MST sequence of commands in a second SMART log.

7. The method of claim 1, wherein the MST sequence of commands specifies any one or more of writing, erasing, and verifying of the storage media.

8. The method of claim 1, further comprising the external host device executing a secure erasure of the storage media.

9. The method of claim 1, wherein the MST sequence of commands is arranged as a script in a selected sequence, the storage controller executing the script responsive to the MST flag.

10. A storage device comprising:
    an event log;
    storage media; and
    a storage controller configured to receive a manufacturing self test (MST) sequence of commands from an external host device and store it in the event log, further configured to set an MST flag corresponding to instructions in an MST_START command from the external host device defining when to begin executing the MST sequence of commands, wherein the MST flag corresponds to a next power-on event so that the storage controller executes the MST sequence of commands responsive to a subsequent transition of the storage device from a powered down state to an operationally powered state, the storage controller thus configured to begin the storage device self-executing the MST sequence of commands to log results of the MST sequence of commands in the event log without interaction with the external host device, and after the MST sequence of commands is completed, the storage device transferring the logged results to the external host device.

11. The storage device of claim 10, characterized as a solid state drive (SSD), the storage media comprising flash memory.

12. The storage device of claim 10, wherein the storage controller is further configured to execute a grown defect test upon the storage media, to generate a grown defect list, and to transfer the grown defect list to the host device.

13. The storage device of claim 10, wherein the storage controller further performs a secure erasure of the storage media at a conclusion of the execution of the MST sequence of commands.

14. The storage device of claim 10, wherein the MST sequence of commands configures an addressable block size of the storage media for use by a subsequent host device.

15. The storage device of claim 10, wherein the event log comprises a Self-Monitoring Analysis and Reporting Technology (SMART) log.

16. The device of claim 10, wherein the MST sequence of commands specifies any one or more of writing, erasing, and verifying of the storage media.

17. The device of claim 10, wherein the MST sequence of commands is arranged as a script in a selected sequence, the storage controller executing the script in response to the MST flag.

* * * * *